United States Patent
Miyatani

(10) Patent No.: US 6,677,820 B2
(45) Date of Patent: *Jan. 13, 2004

(54) DISTORTION COMPENSATION APPARATUS

(75) Inventor: Tetsuhiko Miyatani, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/029,918

(22) Filed: Dec. 31, 2001

(65) Prior Publication Data

US 2002/0079964 A1 Jun. 27, 2002

Related U.S. Application Data

(63) Continuation of application No. 09/818,898, filed on Mar. 28, 2001, now Pat. No. 6,388,518.

(30) Foreign Application Priority Data

Aug. 30, 2000 (JP) ........................................ 2000-260214

(51) Int. Cl.[7] .............................................. H03F 1/26
(52) U.S. Cl. ...................................... 330/149; 330/107
(58) Field of Search .............................. 330/149, 136, 330/107

(56) References Cited

U.S. PATENT DOCUMENTS

| | | | |
|---|---|---|---|
| 5,101,173 A | 3/1992 | DiPiazza et al. | 330/136 |
| 5,903,611 A | 5/1999 | Schnabl et al. | 455/126 |
| 5,929,704 A | 7/1999 | Proctor et al. | 330/149 |
| 6,075,411 A | 6/2000 | Briffa et al. | 330/149 |
| 6,188,277 B1 | 2/2001 | Borodulin et al. | 330/107 |
| 6,275,685 B1 | 8/2001 | Wessel et al. | 330/149 |
| 6,314,142 B1 * | 11/2001 | Perthold et al. | 330/149 |
| 6,507,731 B1 * | 1/2003 | Hasegawa | 330/149 |

* cited by examiner

Primary Examiner—Khanh Van Nguyen
(74) Attorney, Agent, or Firm—Wenderoth, Lind & Ponack, L.L.P.

(57) ABSTRACT

A distortion compensation apparatus for compensating for the distortion occurring in an amplifier with high precision is provided. Distortion generating devices generate a distortion of amplitude or phase on a signal to be provided for an amplifier. A signal level detecting device detects a level of the signal provided for the amplifier, and a distortion amount control system controls the amount of distortion generated by the distortion generating devices on the basis of the level detected by the signal level detecting device, and at this time, a control timing adjusting system adjusts the timing for controlling the distortion amount by a distortion amount control system (D/A converters) so that the distortion occurring in the amplifier maybe compensated sufficiently.

11 Claims, 13 Drawing Sheets

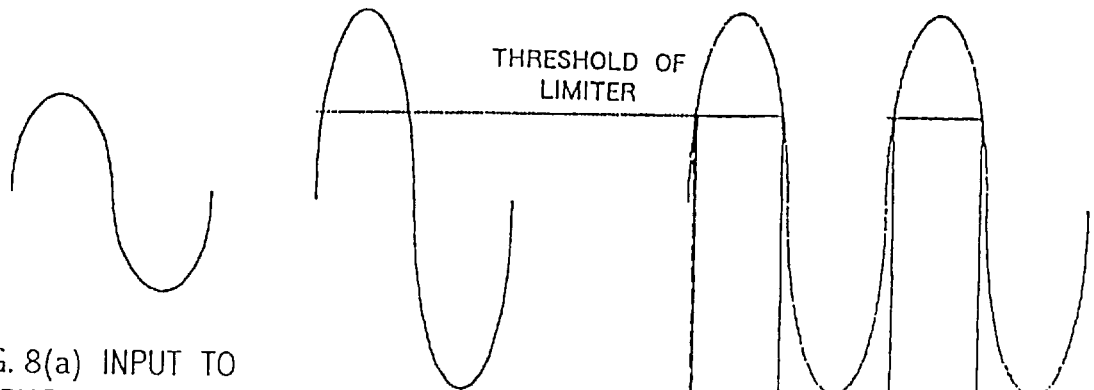
FIG. 8(a) INPUT TO VARIABLE AMPLIFIER
FIG. 8(b) OUTPUT FROM VARIABLE AMPLIFIER
FIG. 8(c) OUTPUT FROM LIMITER
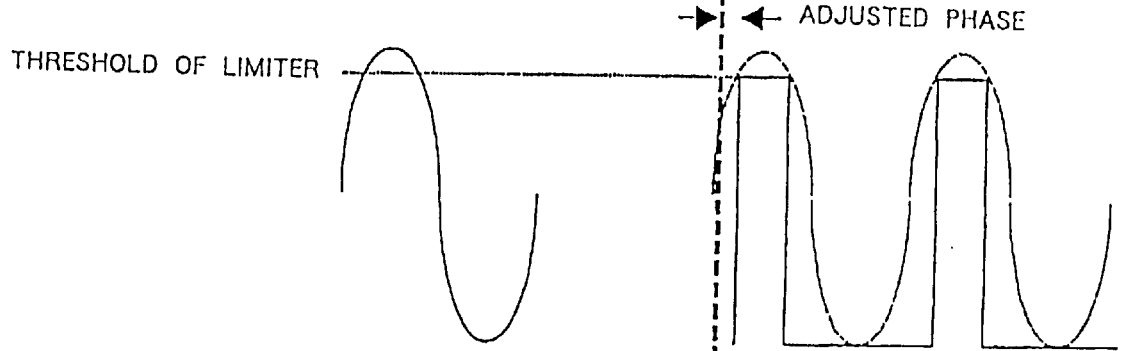
FIG. 8(d) OUTPUT FROM VARIABLE AMPLIFIER
FIG. 8(e) OUTPUT FROM LIMITER
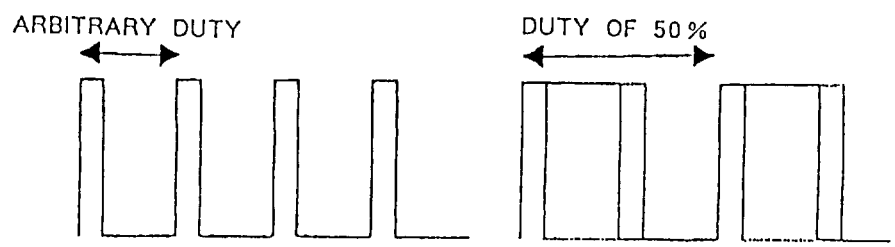
FIG. 8(f) OUTPUT FROM LIMITER
FIG. 8(g) OUTPUT FROM FLIP-FLOP (NORMAL)

DISTORTION COMPENSATION APPARATUS

This is a Continuation of Ser. No. 09/818,898, filed on Mar. 28, 2001 now U.S. Pat. No. 6,388,518.

BACKGROUND OF THE INVENTION

1. Field of the Invention

The present invention relates to a distortion compensation apparatus to compensate for distortion occurring in an amplifier, and more particularly to a distortion compensation apparatus for realizing distortion compensation of high precision, by adjusting the timing for controlling the amount of distortion generated on a signal to be provided for the amplifier.

2. Description of the Related Art

For example, in a mobile wireless communication system such as cellular phone system, in order to assure wireless communication with a mobile station existing at an end of an area (cell) covered by a base station, and in order to realize wireless transmission of signals simultaneously to plural mobile stations (plural users) from the base station depending on the status of communication, the base station is required to send signals with a large power. Similarly, in a repeater station (repeating amplifier) for receiving wireless transmitted signals from the base station, amplifying these signals, and sending the amplified signals to mobile stations by wireless transmission, it is also required to send signals with a large power.

Accordingly, in such a base station or a repeater station, signals to be transmitted (for example, modulated waves) are amplified to a desired level by means of a (large) power amplifier (PA) capable of covering a physical distance up to the end of the cell. In such an amplifier, however, a nonlinear response (AM-AM conversion or AM-PM conversion) characteristic may take place near the critical point (saturation point) of an element, and nonlinear distortion may occur.

Radio Law demands wireless communication service providers to strictly regulate their band limit in order to eliminate effects between different services of wireless communication offered by using adjacent bands.

As a method of compensating for nonlinear distortion occurring in the amplifier, hitherto, it was proposed to use a predistorter type compensation system to compensate for the nonlinear distortion by generating distortion having a reverse characteristic to the nonlinear distortion occurring in the amplifier (that is, the distortion to cancel the nonlinear distortion) in a prior stage.

Other methods of compensating for nonlinear distortion include, for example, a feed-forward type distortion compensation system and negative feedback type distortion compensation system. In the feed-forward type distortion compensation system, the operation is advantageously stable, but it is required to extract a distortion component (occurring in the main amplifier) in the distortion detecting loop, and to amplify the distortion component with a sub amplifier in the distortion compensation loop and subtract the amplified signal from the output signal of the main amplifier. Hence, there are problems in that the circuit is complicated, and the power source efficiency is lowered by the sub amplifier. In contrast, in the predistorter type distortion compensation system, the structure is relatively simple, and a sub amplifier is not needed, and it is, hence, advantageous in both circuit scale and power source efficiency.

An example of a (distortion compensation) amplifying device having a predistorter for compensating for distortion by such a predistorter type distortion compensation system is explained below.

FIG. 11 shows an example of circuitry of an amplifying device with a predistorter (amplifier with predistortion function), and the operation of this amplifying device is explained below by referring to the diagram. This amplifying device is installed in the transmission section of a base station or repeater station, and the signal to be transmitted (transmission signal) is entered from a transmitter. This signal is amplified in the amplifier, and sent out to an antenna.

First, the signal to be transmitted which is issued from the transmitter is put into this predistortion circuit, and the signal is distributed into two, and one distribution signal is fed into delay means 81, and other distribution signal is fed into a level detector 85.

FIG. 12 shows an example of spectrum of a signal in an input stage from the transmitter to the amplifying device, in which the axis of abscissas denotes the signal frequency [kHz], and the axis of ordinates indicates the signal level by power ratio [dB]. As shown in the diagram, at this stage, there is no distortion by a predistorter (a variable attenuator 82 and a variable phase shifter 83) and no distortion by an amplifier 84, and hence the spectrum shows a low level of an unnecessary signal out of the band of use.

The delay means 81 delays the input signal (one distribution signal), and it sends it to the variable attenuator 82.

The variable attenuator 82 changes (attenuates) the amplitude of the signal entered from the delay means 81, depending on the (analog) control signal entered from a D/A converter 88, described below, to generate an amplitude distortion in an amount corresponding to the control signal to the input signal, and sends this signal (including amplitude distortion) to the variable phase shifter 83.

The variable phase shifter 83 changes the phase of the signal entered from the variable attenuator 82 depending on the (analog) control signal entered from a D/A converter 89, described below, to generate a phase distortion in an amount corresponding to the control signal to the input signal, and sends this signal (including phase distortion) to the amplifier 84.

In this example, the predistorter (predistortion generator) is composed of the variable attenuator 82 and variable phase shifter 83 connected in series and control systems 81, 85 to 90 for controlling them.

The amplifier 84 amplifies the input signal from the variable phase shifter 83 to a desired level, and sends out the amplified signal (from the amplifying device) to the antenna.

FIG. 13 shows an example of a spectrum of a signal issued from the amplifier 84 when the distortion is not compensated, in which the axis of abscissas denotes the signal frequency [kHz], and the axis of ordinates indicates the signal level by power ratio [dB]. As shown in the diagram, in this case, the spectrum shows there is a distortion component (leak power to adjacent channels) out of the band of use due to distortion occurring in the amplifier 84.

Such a distortion component can be compensated for by generating distortion of a reverse characteristic to the distortion occurring in the amplifier 84 (amplitude distortion or phase distortion) by the predistorter (variable attenuator 82 and variable phase shifter 83).

FIG. 14 shows an example of a spectrum of a signal issued from the amplifier 84 when the distortion is compensated for by the predistorter, in which the axis of abscissas denotes the signal frequency [kHz], and the axis of ordinates indicates the signal level by power ratio [dB]. As shown in the diagram, in this case, the spectrum shows a decrease of the distortion component (leak power to adjacent channels) out of the band of use occurring in the amplifier 84.

The level detector 85 is composed of, for example, an envelope detector for detecting the envelope of a signal, a low pass filter (LPF) for extracting a specific frequency component only about the detected envelope, and an A/D (analog/digital) converter for converting the detected envelope component from analog to digital signal. The level detector 85, having such a structure, detects the level (for example, power level) of the input signal (other distribution signal), and issues the result of detection to a controller 90 by a digital value.

Distortion extracting means 86 is composed of, for example, a directional coupler, and extracts distortion (for example, part of the amplified signal) included in the amplified signal issued from the amplifier 84, and sends out to the controller 90.

A clock source 87 generates a clock signal of a specified period, and issues and supplies the clock signal to the level detector 85 or each processing unit for digital processing such as the two D/A converters 88, 89 described below.

The D/A (digital/analog) converter 88 converts the digital control signal entered from the controller 90, described below, into an analog control signal, according to the timing corresponding to the clock signal entered from the clock source 87, and issues it to the variable attenuator 82. This control signal is for controlling the amplitude change amount (that is, the amount of amplitude distortion to be generated) in the variable attenuator 82.

The D/A converter 89 converts the digital control signal entered from the controller 90, described below, into an analog control signal according to the timing corresponding to the clock signal entered from the clock source 87, and issues it to the variable phase shifter 83. This control signal is for controlling the phase change amount (that is, the amount of phase distortion to be generated) in the variable phase shifter 83.

The controller 90 is composed of, for example, a digital signal processor (DSP). On the basis of the detection result (detected level) entered from the level detector 85, the controller 90 sends a digital control signal for realizing the amplitude change amount corresponding to the detection result to the D/A converter 88 from the variable attenuator 82, and sends the digital control signal for realizing the phase change amount corresponding to the detection result to the D/A converter 89 from the variable phase shifter 83.

More specifically, in the nonlinear characteristic of the amplifier 84, since the level of the output signal is not linear to the level of the input signal (AM-AM conversion), amplitude distortion occurs, and since the phase of the output signal is not linear to the level of the input signal (AM-PM conversion), phase distortion occurs. The amount of the generated amplitude distortion or phase distortion varies depending on the level of the signal provided for the amplifier 84 (the level of the input signal, the level of the output signal). Accordingly, the controller 90 generates an amplitude distortion of the amount for canceling the amplitude distortion generated in the amplifier 84 by the variable attenuator 82, on the basis of the result of detection by the level detector 85 which is the level reflecting the level of the signal provided for the amplifier 84, and generates the phase distortion of the amount for canceling the phase distortion occurring in the amplifier 84 by the variable phase shifter 83.

For example, the correction amplitude distortion characteristic (the characteristic reverse to the amplitude distortion) for compensating for the amplitude distortion occurring in the amplifier 84 and the correction phase distortion characteristic (the characteristic reverse to the phase distortion) for compensating for the phase distortion occurring in the amplifier 84 are preliminarily calculated (or measured), and a correction table storing the control value relating to the amplitude distortion and the control value relating to the phase distortion corresponding to each other, for example, with respect to the value of detection result by the level detector 85 is saved in the memory of the controller 90. In this case, the controller 90 reads out the control value relating to the amplitude distortion and the control value relating to the phase distortion corresponding to the value of the detection result entered from the level detector 85 from the correction table, and issues these two control values to the respective D/A converters 88, 89 as a digital control signal for controlling the variable attenuator 82 and a digital control signal for controlling the variable phase shifter 83.

The controller 90 detects the level (for example, power level) of the distortion component (signal component out of the band of use) from the signal entered, for example, from the distortion extracting means 86, and can update the content of the correction table so that the level to be detected may be smaller (preferably minimum), that is, the distortion compensation amount may be larger, thereby enhancing the precision of distortion compensation.

The delay means 81 has the role of compensating for the time difference (delay time) of the timing of the one distribution signal processed by the variable attenuator 82 or variable phase shifter 83, and the timing of the control signal corresponding to the level of the other distribution signal entering the variable attenuator 82 or variable phase shifter 83 from the controller 90 through the D/A converters 88, 89 (ideally the role of matching these two timings).

That is, when generating distortion (amplitude distortion, phase distortion) by the variable attenuator 82 or variable phase shifter 83 in a certain signal portion of the input signal, the variable attenuator 82 or variable phase shifter 83 must be controlled by a control signal depending on the level of the corresponding signal portion (not other signal portion), and the delay means 81 is provided for compensating for the timing of such processing.

However, in the delay means 81 as shown in FIG. 11, for example, it is disadvantageously hard to adjust the delay time finely (precisely), and if the delay time becomes long, the precision of distortion compensation deteriorates. These defects are described in detail.

That is, in the delay means 81, it is necessary to adjust the delay time occurring in a physical wiring path, aside from the delay time taken for the processing of the D/A conversion of the digital control signal, depending on the detection result, by detecting the level of the other distribution signal.

As a result of an investigation of, for instance, an amplifying device assumed by the present inventors (however, this is an example, and the invention is not limited to this example), for adjustment of delay time, it is required to adjust in the order of 500 psec (picoseconds or $10^{-12}$ seconds). When this delay time is adjusted by a semi-rigid cable, a cable of about 10 cm is used. Generally, it is about 30 to 40 cm from end to end of an electronic device (circuit) board, and the distance of about 10 cm corresponds to a delay time easily occurring due to layout of wiring.

Besides, such delay time also varies depending on, for example, the parasitic capacity of the board, or individual differences of the devices. In other words, it was hitherto required to adjust the delay time by controlling the cable length for every device manufactured (for example, the amplifying device shown in FIG. 11). Moreover, this delay time varies with, for example, temperature characteristics of electronic devices, and the delay time is changed (more or less) when the temperature varies. This delay time also varies with the duration of use (aging effects).

Thus, such adjustment of delay time is a very important element in the manufacturing of the device, and it was hitherto difficult to adjust the delay time in very small time units, and if a difficult adjustment takes a very long time to perform, the device becomes very expensive.

The following example shows a result of computer simulation about the effect of the adjustment error of delay time on the distortion compensation by a predistorter.

In this example, a single carrier of 5 MHz band is used, and the condition about the waveform of the signal to be transmitted conforms to, for example, the specification of 3GPP (3rd Generation Partnership Project), that is, the number of users is 50, and the roll-off rate of the filter for limiting the band of the signal is 0.22.

Parameters for investigating the level of distortion component include third-degree mutual modulation component (IM3), fifth-degree mutual modulation component (IM5), and others, but in this example, for the sake of simplicity of explanation, the level of the distortion component is expressed by the adjacent channel power ratio (ACPR) [dBc] showing the level of power leaking to a band adjacent to the band of use.

Specifically, FIG. 15 shows an example of a result of computer simulation about the effect of the delay time (a relative delay time of a system for processing one distribution signal and a system for processing the other distribution signal) on the correction (compensation) of amplitude distortion, in which the axis of abscissas denotes the (relative) delay time [×2 nsec (nanoseconds or $10^{-9}$ seconds)] (for instance, graduation 2 indicates 4 nsec), and the axis of ordinates represents the level of distortion component expressed by the adjacent channel power ratio (ACPR) [dBc]. In this simulation, the delay time about the correction of phase distortion (for example, by variable phase shifter 83) is supposed to be zero.

Moreover, FIG. 16 shows an example of a result of computer simulation about the effect of the (relative) delay time on the correction (compensation) of phase distortion, in which the axis of abscissas denotes the (relative) delay time [×2 nsec], and the axis of ordinates represents the level of distortion component expressed by the adjacent channel power ratio (ACPR) [dBc]. In this simulation, the delay time about the correction of amplitude distortion (for example, by variable phase shifter 83) is supposed to be zero.

As shown in FIG. 15, the effect of the delay time on the compensation of amplitude distortion is relatively small, but as shown in FIG. 16, the effect of delay time on compensation of phase distortion is relatively large, and the ACPR deteriorates as the delay time (or its adjustment error) becomes larger.

Herein, the reason why the effect of the delay time is greater on the compensation of phase distortion than on the compensation of amplitude distortion is that, generally, the gain variation is smaller in the amplitude distortion (AM-AM conversion) in the amplifier, but the gain variation amount is larger in the phase distortion (AM-PM conversion) in the amplifier. That is, concerning the phase distortion in the amplifier, since its variation width is large, the precision of compensation (ACPR, in this case) changes significantly if the delay time is deviated only slightly.

Numerical values presented as a result of computer simulation shown in FIG. 15 and FIG. 16 are considered to vary depending, for example, on the amplifying devices used in the simulation, but the tendency of the compensation of phase distortion having a larger effect of delay time as compared with the compensation of amplitude distortion seems to be the same as the result of this simulation.

The invention is devised to solve these conventional problems, and it is, hence, an object thereof to provide a distortion compensation apparatus capable of, realizing distortion compensation of high precision by adjusting the delay time finely (precisely), as mentioned above, and adjusting the timing for controlling the amount of distortion generated on the signal provided for the amplifier finely (precisely), when compensating for the distortion occurring in the amplifier.

SUMMARY OF THE INVENTION

To achieve the object, in the distortion compensation apparatus of the invention, distortion occurring in the amplifier is compensated for in the following manner.

That is, in the distortion generating means for generating distortion of at least one of amplitude and phase on the signal to be provided for the amplifier, the signal level detecting means detects the level of the signal provided for the amplifier, and the distortion amount control means controls the amount of distortion to be generated by the distortion generating means on the basis of the level detected by the signal level detecting means, and the control timing adjusting means adjusts the timing for controlling the amount of distortion by the distortion amount control means so that the distortion occurring in the amplifier may be compensated for sufficiently.

Therefore, by a novel method of adjustment for adjusting the timing for controlling the amount of distortion generated on the signal provided for the amplifier, for example, the timing can be adjusted finely (precisely), so that distortion compensation of a high precision is realized.

The amplifier, as the object of distortion compensation, is not particularly limited, and, for example, the amplifier may also be composed of plural amplifiers. The invention is intended to compensate for the amplitude distortion or phase distortion occurring in such an amplifier.

The degree of compensation of distortion occurring in the amplifier is preferred to be enough to decrease the distortion to zero, but in the invention, it is not always intended to decrease the distortion to zero, and it is enough to decrease the distortion substantially.

To generate distortion by the distortion generating means on the signal provided for the amplifier, for example, distortion may be generated on the signal before being amplified by the amplifier, or distortion may be also generated on the signal after being amplified by the amplifier.

The distortion generating means is preferred to have both a function of generating amplitude distortion and a function of generating phase distortion, but it may also be composed to have a function of generating amplitude distortion only or a function of generating phase distortion only.

To detect the level of the signal provided for the amplifier by the signal level detecting means, for example, the level of the signal before being amplified by the amplifier maybe detected, or the level of the signal after being amplified by the amplifier may be detected.

The level to be detected is not limited, and, for example, the level of signal amplitude or the level of signal power (usually proportional to the square of the amplitude) may be detected.

The distortion amount control means controls the amount of distortion to be generated by the distortion generating means so that the amount of distortion (distortion of reverse characteristic to the distortion occurring in the amplifier) generated by the distortion generating means is enough to cancel the amount of distortion (amplitude distortion or phase distortion) occurring in the amplifier. The amount of distortion (amplitude distortion or phase distortion) occurring in the amplifier may be estimated, for example, from the level detected by the signal level detecting means.

The degree of compensation of distortion occurring in the amplifier by the control timing adjusting means is not particularly defined, various degrees may be employed as described above, and if the distortion is not compensated to zero, it is enough, as far as the distortion compensation is realized, to be at a practically effective efficiency.

Adjustment of timing for controlling the amount of distortion by the distortion control means by the control timing adjusting means corresponds to the adjustment of delay time in the prior art.

The control timing adjusting means is preferred to adjust the timing (always or periodically) for controlling the amount of distortion by the distortion amount control means so that the amount of compensation maybe large, for example, by detecting always (or, for example, periodically) the amount of compensation of distortion occurring in the amplifier, but it may also be designed to set (or fix) the adjustment time preliminarily so that the distortion occurring in the amplifier may be compensated substantially.

In the distortion compensation apparatus of the invention, preferably, the distortion generating means is composed of circuit (an amplitude changing circuit or a phase changing circuit) for changing the amount of distortion (amplitude distortion or phase distortion) occurring depending on the analog control signal entered from outside (herein, D/A converting means as described later).

The distortion amount control means is composed of D/A converting means for converting a digital control signal into an analog control signal, and issuing it at a timing depending on a timing signal entered from outside (herein, the control timing adjusting means), and controls the amount of distortion (amplitude distortion or phase distortion) generated by the distortion generating means by sending a digital control signal to the distortion generating means through this D/A converting means.

The control timing adjusting means is composed of clock signal generating means for generating a clock signal of a predetermined period, and timing signal generating means for generating a timing signal adjusted of timing from the clock signal generated by this clock signal generating means, and adjusts the timing for controlling the amount of distortion by the distortion amount control means by sending a timing signal generated by the timing signal generating means to the D/A converting means.

In the distortion compensation apparatus of the invention, preferably, the distortion amount control means further includes memory means for storing the control value (the control value for controlling the amount of distortion (amplitude distortion or phase distortion) generated by the distortion generating means) in correspondence to the signal level, and controls the amount of distortion (amplitude distortion or phase distortion) generated by the distortion generating means by sending the control value corresponding to the level detected by the signal level detecting means to the distortion generating means through the D/A converting means as a digital control signal from the memory means.

In the distortion compensation apparatus of the invention, preferably, the timing signal generating means is composed of a variable amplifier for amplifying a clock signal generated by the clock signal generating means by a variable gain, and a limiter for limiting the level to a predetermined level and issuing the level of the signal if the level of the signal provided for the variable amplifier is more than a predetermined threshold, and adjusts the gain of the variable amplifier so that the output signal from the limiter adjusted of timing of level limiting is issued as a timing signal.

Herein, the predetermined threshold may be any one of various values depending on, for example, the status of use of the apparatus. The predetermined level is also not specified, and, for example, the predetermined threshold (its same level) may be used.

In the distortion compensation apparatus of the invention, preferably, the timing signal generating means is composed of a comparator for producing an ON signal by using a variable threshold when the level of the clock signal generated by the clock signal generating means is more than the threshold, and producing an OFF signal when the level of the clock signal is less than the threshold, and adjusts the threshold of the comparator so that the output signal from the comparator adjusted of on/off timing is issued as a timing signal.

Herein, the predetermined threshold may be any one of various values depending on, four example, the status of use of the apparatus.

For example, in the case of a digital signal composed of a value 1 and value 0, the ON signal corresponds to the value 1 signal (or value 0 signal), and the OFF signal corresponds to value 0 signal (or value 1 signal).

In the distortion compensation apparatus of the invention, preferably, the timing signal generating means is composed of a limiter for limiting the level to a predetermined level and issuing the level of the signal by using a variable threshold if the level of the clock signal generated by the clock signal generating means is more than the threshold, and adjusts the threshold of the limiter so that the output signal from the limiter adjusted of timing of level limiting is issued as a timing signal.

Herein, the predetermined threshold may be any one of various values depending on, for example, the status of use of the apparatus. The predetermined level may include various levels, and, for example, the predetermined threshold (its same level) may be used.

In the distortion compensation apparatus of the invention, preferably, the duty (the ratio of occupation of ON state in the signal composed of ON state and OFF state) of the timing signal can be varied by using a flip-flop. That is, the timing signal generating means further includes a flip-flop for receiving an output signal adjusted of timing (output signal from the limiter or comparator), and issuing a signal changed in the duty of the signal, and the output signal from the flip-flop is issued as a timing signal.

In the distortion compensation apparatus of the invention, preferably, the duty of the timing signal can be changed by using a flip-flop, and also the timing of the timing signal can be adjusted (in a wider range) by using a selector. That is, the timing signal generating means further includes a flip-flop for receiving an output signal adjusted of timing (output signal from the limiter or comparator), and issuing a signal changed in the duty of the signal and a signal inverted in on/off switching of the signal (that is, the signal changed in the duty of the output signal and inverted in on/off switching), and a selector for selecting and issuing one of the two signals produced from the flip-flop, and the output signal from the selector is issued as a timing signal.

In the distortion compensation apparatus of the invention, preferably, the distortion generating means is composed of a series connection of a variable attenuator for generating amplitude distortion to the signal by varying the amplitude of the signal provided for the amplifier, and a variable phase shifter for generating phase distortion to the signal by the phase of the signal provided for the amplifier.

The distortion amount control means controls the amount of amplitude distortion generated by the variable attenuator by controlling the amplitude change amount generated by the variable attenuator, and controls the amount of phase distortion generated by the variable phase shifter by controlling the phase change amount generated by the variable phase shifter.

The control timing adjusting means deviates the timing of controlling the amount of amplitude distortion generated by the distortion amount control means and the timing for controlling the amount of phase distortion generated by the distortion amount control means (for example, by the time corresponding to the deviation), depending on the lag between the timing of the signal (the signal provided for the amplifier) processed by the variable attenuator and the timing of the signal processed by the variable phase shifter.

Herein, the sequence of the connection of the means for generating amplitude distortion to the signal provided for the amplifier (herein, variable attenuator) and the means for generating phase distortion to the signal (herein, variable phase shifter) is not specified, that is, amplitude distortion may be generated first and then the phase distortion later on the signal, or phase distortion may be generated first and then the amplitude distortion later on the signal.

The distortion compensation apparatus of the invention is, preferably, installed in a wireless transmission apparatus for transmitting signals by wireless means, and compensates for the distortion occurring in the amplifier for amplifying the signal to be transmitted by the wireless transmission apparatus. The control timing adjusting means adjusts the timing for controlling the amount of distortion by the distortion amount control means, within an error in a unit of seconds of less than the value of a reciprocal number of the value of the band of the signal to be transmitted multiplied by eight (8) (for example, the value of the carrier frequency interval multiplied by the number of carriers).

The wireless transmission apparatus may be any apparatus, and preferably, the base station or repeater station (repeating amplifier) in a mobile wireless communication system may be used. The wireless transmission apparatus is not limited to the apparatus having the wireless transmission function only, and may include an apparatus having both the wireless transmission function and a wireless reception function (that is, wireless communication apparatus).

The value of eight (8) corresponds to the number of over-samplings, and the value is preferred to be 8 or more as shown above.

More specifically, the error due to timing adjustment is explained by referring to an example of computer simulation result shown in FIG. 15 and FIG. 16, as an example of digital predistortion. Ideally, an optimum distortion compensation (distortion elimination) is realized when the (relative) delay time shown in the prior art is zero, but herein, considering an actual apparatus (causing a certain error), it is investigated if effective distortion compensation is realized by decreasing the delay time by an amount by referring to the formulas and examples of computer simulation result, mentioned above.

Generally, in predistortion, distortion is generated by the envelope of the signal (the signal to be amplified) entered in the amplifier. In the amplifier, the nonlinear operation of AM-AM conversion and AM-PM conversion is carried out by the device, and it is the cause of distortion. Herein, the AM-AM conversion shows a phenomenon in which the gain of the amplifier is not constant when the level of the input signal is large, and the AM-PM conversion shows a phenomenon in which the phase (output phase) of the signal issued from the amplifier is changed depending on the level of the input signal.

Herein, the input signal is a signal to be amplified, and the band of the signal to be amplified is expressed as shown in formula (1). The carrier frequency interval is the frequency interval for detuning adjacent carriers, for example, in the multi-carrier signal (having plural carrier frequencies). For example, in the present specification of 3GPP, the carrier frequency interval is 5 MHz. The number of carriers is the number of carriers included in the multi-carrier signal (differing in frequency). For example, in the single carrier transmission, the number of carriers=1.

$$\text{Band of signal to be amplified} = \text{carrier frequency interval} \times \text{number of carriers} \quad (1)$$

Assuming, for example, a multi-carrier signal of four carriers (carrier signal=1), in this case, the band width of the signal to be amplified is 20 MHz (5 MHz×4 carriers).

In digital predistortion, predistortion is executed depending on the fluctuation of the envelope of the input signal. According to the generally known sampling theorem, in order to follow up the fluctuation of envelope of input signal accurately, it is required to execute sampling of 2 times or more of the signal band width.

That is, the operation period Ts [sec] of the digital circuit required in this case is expressed in formula (2). As the number of over-samplings, a numerical value of 2 or more is set.

$$Ts=1/(\text{band of signal to be amplified} \times \text{number of over-samplings}) \quad (2)$$

For example, in the case of a band of signal to be amplified of 5 MHz and 4-times sampling (number of over-samplings=4), Ts is 50 (=1/20 MHz) [nsec]. In this case, as over-sampling, it means to follow up (to sample) at a speed of 4 times on the envelope fluctuating at a speed of 5 MHz.

In this case, the maximum value of a relative delay error (delay time) is 25.0 nsec (half of 50 nsec). That is, in the digital system, which operates on the clock, for example, by inverting the on/off state of the clock signal in 50 nsec period composed of ON state (for example, value 1) and OFF state (for example, value 0), and selectively using the normal clock signal (non-inverted clock signal) and inverted clock signal selectively, it is possible to adjust the delay time in the unit of 25.0 nsec, that is, half value of the period.

The example of a result of computer simulation shown in FIG. 15 and FIG. 16 is discussed below. As stated above, since the AM-PM conversion is more likely to have the effect of time delay, as compared with the AM-AM conversion, it is discussed herein on the basis of the example of result of computer simulation about AM-PM conversion shown in FIG. 16.

Suppose the ACPR required in this system is, for example, −65 dBc (the standard is −60 dBc and there is a margin of 5 dB). In this case, referring to FIG. 16, the allowable relative delay error is about −4 nsec to +2 nsec on the basis of the ideal point (the point where the relative delay time is zero). That is, the allowable fluctuation range is 6 nsec, and there is no problem as long as the delay time is less than this range.

For example, assuming a system of 4-times sampling by using a single carrier, a delay time T1 adjustable by a clock signal (of normal rotation only) is expressed in formula (3), and a delay time T2 adjustable when using also a clock signal of inverse rotation is expressed in formula (4).

$$T1 = 1/(\text{signal band} \times \text{number of over-samplings}) \quad (3)$$
$$= /(5 \text{ MHz} \times 4)$$
$$= 50 \text{ nsec}$$

$$T2 = T1/2 \quad (4)$$
$$= 25 \text{ nsec}$$

Discussing the adjustable delay time T2 shown in formula (4), the time unit for adjusting for realizing ACPR of −65 dBc is within 6 nsec, and hence, it is required to adjust by the digital clock and adjust the delay time at a precision of 8 times.

Summing them up, to realize ACPR of −65 dBc, a time unit T3 to be adjusted is shown in formula (5). In the formula, n denotes the value of the number of over-samplings (4 in this example), and 8 is the required precision acquired by computer simulation.

$$T3 \leq \{1/(\text{signal band} \times n \times 8)\} \times \quad (5)$$
$$(\text{adjustment amount by clock inversion } 1/2)$$
$$= \{1/(5 \text{ MHz} \times 4 \times 8)\} \times (1/2)$$
$$= 6.25 \text{ nsec}/2$$
$$= 3.125 \text{ nsec}$$

Suppose the ACPR required in the system is about −60 dBc. In this case, referring to FIG. 16, the allowable relative delay error is about −8 nsec to +6 nsec, on the basis of the ideal point (the point where the relative delay time is zero). That is, the allowable fluctuation range is 14 nsec, so that it is enough to adjust the delay time within an error of 14 nsec.

Similarly, to realize ACPR of −60 dBc, a time unit T4 to be adjusted is shown in formula (6). In the formula (6), when the number of over-samplings is 4, the clock inversion is used, and further, by adjustment of delay time at a precision of 2 times, it means that the desired ACPR is achieved.

$$T4 \leq \{1/(\text{signal band} \times n \times 2)\} \times \quad (6)$$
$$(\text{adjustment amount by clock inversion } 1/2)$$
$$= \{1/(5 \text{ MHz} \times 4 \times 2)\} \times (1/2)$$
$$= 25 \text{ nsec}/2$$
$$= 12.5 \text{ nsec}$$

Further, suppose that the ACPR required in the system is, for example, −55 dBc. Herein, ACPR=−55 dBc corresponds, in the 3GPP standard, to an allowable next adjacent channel leak power ratio (expressing an allowable leak power to a next adjacent channel). The next adjacent channel represents a frequency band deviated in the frequency interval from the adjacent carrier further by one carrier.

As a specific example, when the frequency of the transmission signal carrier is 2.1125 GHz and the carrier frequency interval is 5 MHz (=0.005 GHz), the frequency of the adjacent channel is 2.1175 GHz (or 2.1075 GHz), and the frequency of the next adjacent channel is 2.1225 GHz (or 2.1025 Ghz). That is, it is shifted by each carrier frequency interval (5 MHz) from the reference carrier to adjacent channel, and from adjacent channel to next adjacent channel.

Generally, in actual predistortion, a distortion situation different from the distortion occurrence situation of a pure amplifier occurs. That is, in distortion by the amplifier only, the amount of distortion attenuation attenuates as the frequency interval from the reference channel becomes wider, from reference channel to adjacent channel and to next adjacent channel. In predistortion, on the other hand, for example, the amount of distortion in the adjacent channel and the amount of distortion in the next adjacent channel may be nearly the same quantity.

Accordingly, if the leak power standard in, for example, the adjacent channel is achieved, it is not always guaranteed that the leak power standard is achieved in the next adjacent channel.

Considering this point, herein, an example of −55 dBc which is the standard of next adjacent channel leak power is discussed.

In this case, referring to FIG. 16, the allowable relative delay error is about −13 nsec to +12 nsec on the basis of the ideal point (the point where the relative delay time is zero). That is, the allowable fluctuation range is 25 nsec, and it is enough to adjust the delay time within an error of 25 nsec.

Similarly, to realize ACPR of about −55 dBc, a time unit T5 to be adjusted is shown in formula (7). In the formula (7), when the number of over-samplings is 4, by using the clock inversion, (by adjusting the delay time at a precision of 1 times), it is shown that the desired ACPR is achieved.

$$T5 \leq \{1/(\text{signal band} \times n)\} \times \quad (7)$$
$$(\text{adjustment amount by clock inversion } 1/2)$$
$$= \{1/(5 \text{ MHz} \times 4 \times 8)\} \times (1/2)$$
$$= 50 \text{ nsec}/2$$
$$= 25 \text{ nsec}$$

Thus, in order to obtain the required distortion amount (herein, ACPR), it is enough to adjust the delay time at least within an error of 1/(signal band width×number of over-samplings), and further, in digital signal processing, since all operation timing is controlled by the clock, it is also possible to adjust the delay time of half clock, for example, by using the inverted clock. Further, according to the example of a computer simulation result shown in FIG. 16, preferably, a design margin for decreasing distortion to a desired distortion amount should be obtained by setting the number of over-samplings at a value of 8 or more.

BRIEF DESCRIPTION OF THE DRAWINGS

FIGS. 8(a)–(g) are diagrams for explaining an example of operation of phase adjusting means.

DESCRIPTION OF THE PREFERRED EMBODIMENTS

Figure 1:
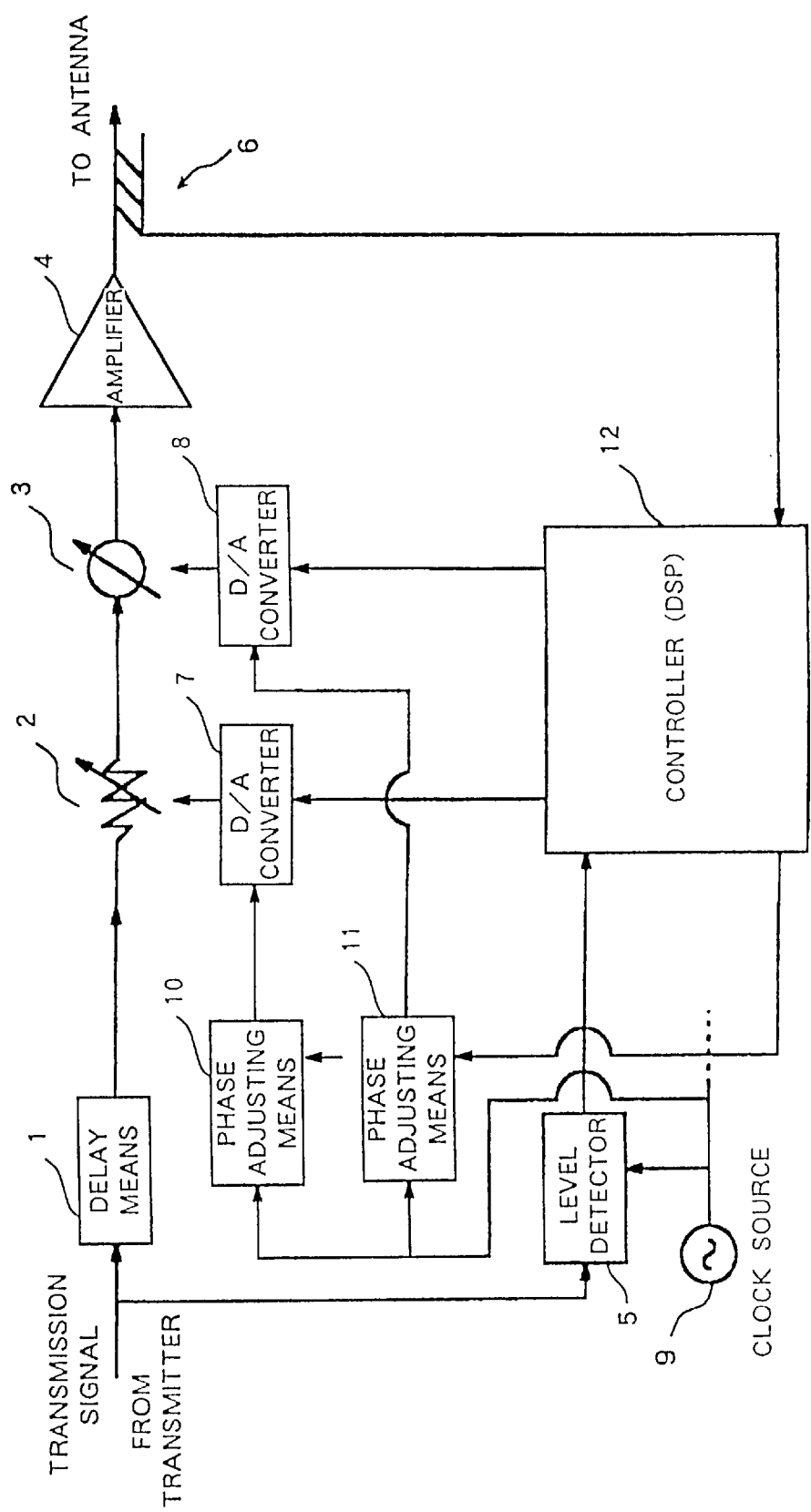
FIG. 1 is a diagram showing an example of circuitry of an amplifying device having a predistorter in a first embodiment of the invention.

Referring now to the drawings, a(n) (distortion compensation) amplifying device according to a first embodiment of the invention is described below.

The amplifying device of this embodiment has a predistorter as an embodiment of the distortion compensation apparatus of the invention, and the distortion occurring in the amplifier is compensated for by the predistorter type distortion compensation system by using this predistorter.

FIG. 1 shows an example of circuitry of the amplifying device having the predistorter of the example (an amplifier with predistortion function). This amplifying device is provided in the transmission section of a base station or repeater station, for example, in a mobile wireless communication system, and the signal to be transmitted (transmission signal) is entered from a transmitter, and this signal is amplified in the amplifier, and sent out to an antenna.

As shown in FIG. 1, the amplifying device of the example comprises delay means 1 for delaying the transmission signal until the predistortion described below is ready, a variable attenuator 2 for providing the transmission signal with a correction AM-AM characteristic for predistortion, a variable phase shifter 3 for providing the transmission signal with a correction AM-PM characteristic for predistortion, an amplifier 4 for amplifying the transmission signal to a predetermined transmission level, a level detector 5 for detecting the (envelope) level of the transmission signal, distortion extracting means 6 for extracting a distortion component signal from the output signal of the amplifier 4, two D/A converters 7, 8 for converting the digital output signal from a controller 12 into an analog signal, a clock source 9 for providing each digital device with a clock, two phase adjusting means 10, 11 for generating clocks of different phases from the clock generated by the clock source 9, and the controller 12 for adaptively controlling the predistortion and controlling the phase adjusting means 10, 11.

An example of operation of the amplifying device of the embodiment is shown below.

First, the signal to be transmitted issued from the transmitter enters (in the amplifying device of this embodiment), and this signal is distributed into two, and one distribution signal is entered in the delay means 1 and the other distribution signal is fed into the level detector 5.

The delay means 1 delays the input signal (one distribution signal), and then sends it to the variable attenuator 2. The delay means 1 may be composed, for example, by using a delay wire for delaying a signal, or a band pass filter (BPF).

The variable attenuator 2 changes (attenuates) the amplitude of the signal entered from the delay means 1, depending on the (analog voltage) control signal entered from the D/A converter 7, described below, to generate an amplitude distortion in an amount corresponding to the control signal to the input signal, and sends this signal (including amplitude distortion) to the variable phase shifter 3.

The variable phase shifter 3 changes the phase of the signal entered from the variable attenuator 2 depending on the (analog voltage) control signal entered from the D/A converter 8, described below, to generate a phase distortion in an amount corresponding to the control signal to the input signal, and sends this signal (including phase distortion) to the amplifier 4.

In this embodiment, the predistorter is composed of the variable attenuator 2 and variable phase shifter 3 connected in series and control systems 1, 5 to 12 for controlling them.

The amplifier 4 is composed of, for example, a (large) power amplifier, and amplifies the input signal from the variable phase shifter 3 to a desired (power) level, and sends out the amplified signal (from the amplifying device of the embodiment) to the antenna.

In this amplifier 4, for example, when the level of the signal entered from the variable phase shifter 3 is large, amplitude distortion or phase distortion occurs. In this embodiment, the distortion component is compensated for by generating a distortion of reverse characteristic (amplitude distortion or phase distortion) to the distortion occurring in the amplifier 4 by the predistorter (variable attenuator 2 and variable phase shifter 3).

The level detector 5 is composed of, for example, an envelope detector for detecting the envelope of a signal by using a diode, a low pass filter (LPF) for extracting a specific frequency component only about the detected envelope, and an A/D converter for converting the detected envelope component from an analog signal to a digital signal. The level detector 5, having such a structure, detects the level (for example, power level) of the input signal (the other distribution signal), and issues the result of the detection to the controller 12 by a digital value (digitized level information).

The reason for detecting the level of the input signal by the level detector 5 is, in the predistortion of the present embodiment, to correct the output level fluctuation or output phase fluctuation occurring in the amplifier 4 which varies depending on the level of the input signal (in the amplifier 4), that is, it is necessary to detect the level of the transmission signal entered in the amplifier 4 (detected indirectly in this embodiment).

The distortion extracting means 6 is composed of, for example, a directional coupler, and extracts distortion (for example, part of the amplified signal) included in the amplified signal issued from the amplifier 4, and sends the distortion out to the controller 12.

The D/A converter 7 converts the digital control signal entered from the controller 12, described below, into an analog control signal, according to the timing corresponding to the clock signal (timing signal) entered from the phase adjusting means 10, described below, and issues the analog control signal to the variable attenuator 2. This control signal is for controlling the amplitude change amount (that is, the amount of amplitude distortion to be generated) in the variable attenuator 2.

The D/A converter 8 converts the digital control signal entered from the controller 12, described below, into an analog control signal, according to the timing corresponding to the clock signal (timing signal) entered from the phase adjusting means 11, described below, and issues the analog control signal to the variable phase shifter 3. This control signal is for controlling the phase change amount (that is, the amount of phase distortion to be generated) in the variable phase shifter 3.

The clock source 9 generates a clock signal of a predetermined period, and issues and supplies the clock signal to digital processing parts (excluding two D/A converters 7, 8 in this embodiment) such as the level detector 5 and the two phase adjusting means 10, 11, described below.

The phase adjusting means 10 generates a clock signal (timing shifted clock) shifted in phase from the clock signal entered from the clock source 9, according to the control from the controller 12, and sends this clock signal (timing signal) to the D/A converter 7.

The phase adjusting means 11 generates a clock signal (timing shifted clock) shifted in phase from the clock signal entered from the clock source 9, according to the control from the controller 12, and sends this clock signal (timing signal) to the D/A converter 8.

The controller 12 is composed of, for example, a digital signal processor (DSP). On the basis of the detection result (detected level) entered from the level detector 5, the controller 12 sends a digital control signal for realizing the amplitude change amount corresponding to the detection result to the D/A converter 7 for the variable attenuator 2, and sends the digital control signal for realizing the phase change amount corresponding to the detection result to the D/A converter 8 for the variable phase shifter 3.

More specifically, in the nonlinear characteristic of the amplifier 4, since the level of the output signal is not linear to the level of the input signal (AM-AM conversion), amplitude distortion occurs, and since the phase of the output signal is not linear to the level of the input signal (AM-PM conversion), phase distortion occurs, and the amount of the generated amplitude distortion or phase distortion varies depending on the level of the signal provided for the amplifier 4. Accordingly, the controller 12 generates an amplitude distortion of an amount for canceling the amplitude distortion generated in the amplifier 4 by the variable attenuator 2, on the basis of the result of detection by the level detector 5 which is the level reflecting the level of the signal provided for the amplifier 4, and generates the phase distortion of an amount for canceling the phase distortion occurring in the amplifier 4 by the variable phase shifter 3.

For example, the correction amplitude distortion characteristic (the characteristic reverse to the amplitude distortion) for compensating for the amplitude distortion occurring in the amplifier 4 and the correction phase distortion characteristic (the characteristic reverse to the phase distortion) for compensating for the phase distortion occurring in the amplifier 4 are preliminarily calculated (or measured), and a correction table storing the control value relating to the amplitude distortion and the control value relating to the phase distortion corresponding to each other, for example, with respect to the value of detection result by the level detector 5 is saved in a memory of the controller 12. In this case, the controller 12 reads out the control value relating to the amplitude distortion and the control value relating to the phase distortion corresponding to the value (digitized level information) of the detection result entered from the level detector 5 from the correction table, and issues these two control values to the respective D/A converters 7, 8 as a digital control signal for controlling the variable attenuator 2 and a digital control signal for controlling the variable phase shifter 3.

The controller 12 detects the level (for example, power level) of the distortion component (signal component out of band of use) from the signal entered, for example, from the distortion extracting means 6, and can update the content of the correction table so that the level to be detected may be smaller (preferably minimum). That is, the distortion compensation amount may be larger, thereby enhancing the precision of distortion compensation. Moreover, since the value to be corrected (the content in the correction table) can be updated adaptively, it is possible to provide predistortion capable of coping with a very small error of delay time caused by, for example, temperature characteristic change or the aging effect.

Further, the controller 12 controls the phase adjustment (of a clock signal) performed by the phase adjusting means 10, 11, by issuing control signals to the phase adjusting means 10, 11. In this case, the controller 12 of the present embodiment controls the phase adjustment so that the level of the distortion component detected from the signal entered from the distortion extracting means 6 may be smaller (preferably minimum).

Herein, the two phase adjusting means 10, 11 which are characteristic components of the invention are described in further detail.

Same as mentioned in the prior art, in this embodiment, the transmission signal is delayed by the delay means 1 for the preparation time of predistortion, in the digital region. Ideally, concerning an arbitrary signal portion for composing the transmission signal, it is required that the timing of the signal portion to be entered in the variable attenuator 2 or variable phase shifter 3 through the delay means 1, and the timing of the variable attenuator 2 or variable phase shifter 3 controlled by the controller 12 according to the level of the signal portion should have the same timing. In this embodiment, since the error of the delay time by the delay means 1 is relatively large, such a (small) timing is adjusted by the two phase adjusting means 10, 11.

That is, specifically, a clock is supplied in the digital circuit, or analog interface such as an A/D converter or a D/A converter.

For example, supposing a clock signal of 80 MHz is distributed and supplied into each block from the clock source 9, since the period of the clock signal is 12.5 nsec, (by the normal clock signal only), the (relative) delay time can be adjusted only in a unit of 12.5 nsec. Further, by generating an inverse clock signal by using an inverter, for example, it is possible to control in a unit of 6.25 (=12.5/2) nsec. However, the limit is the delay time adjustment in the unit of 6.25 nsec.

As discussed in the problems, however, as a result of an investigation of the amplifying device assumed by the present inventors (this is only an example, and the invention is not limited to this example only), as adjustment of delay time in actual predistortion, it is necessary to adjust the delay time in a unit of about 500 psec.

Accordingly, the amplifying device of the embodiment includes the two phase adjusting means 10, 11, and the phase adjusting means 10 generates a clock signal of an independent phase of the clock signal from the clock source 9. That is, in this embodiment, the clock signal issued from the clock source 9 is fed into the phase adjusting means 10, 11, and the phase of the, clock signal is finely (precisely) adjusted in the phase adjusting means 10, 11, and supplied into each of the D/A converters 7, 8.

In the embodiment, having such a constitution, if the delay time by the delay means 1 is too short or too long, for example, by controlling the phase adjusting means 10, 11 by the control signal from the controller 12, the delay time (control timing of the variable attenuator 2 or the variable phase shifter 3) can be corrected finely (precisely) relatively easily.

As a result, predistortion process can be executed correctly at the timing for processing predistortion on each signal portion composing the transmission signal, and hence, the leak power out of the band left over and contained in the output signal of the amplifier 4 can be sufficiently decreased. Hitherto, a skilled engineer used to adjust the above-described delay time finely (precisely) in about a half of a day, but in the amplifying device of the embodiment, such fine adjustment is easily realized (for example, automatically by the controller 12).

In the embodiment, as a preferred mode, processing timing is adjusted independently on each one of the two D/A converters 7, 8. By contrast, in the configuration for timing adjustment at the time of A/D conversion (for example, at the time of output of detection result from the level detector 5) as the input stage of the digital circuit, it is possible to have timing to be suited to either one of the two D/A converters 7, 8, but it is not possible to have (different) timing suited to each one of the two D/A converters 7, 8.

That is, in the constitution of the embodiment, since the delay time is adjusted (simultaneously) on the two D/A converters 7, 8 provided immediately before the variable attenuator 2 and variable phase shifter 3, it is possible to adjust the delay time due to line difference, for example, in the digital circuit, and hence, it is possible to absorb and eliminate the small (slight) time difference in the line up to the D/A converters 7, 8.

In the constitution of the invention, meanwhile, since there is a deviation (offset time) between the timing of the signal issued from the delay means 1 processed by the variable attenuator 2 and the timing of this signal processed by the variable phase shifter 3, it is preferred that the phase of the clock signal (timing signal) given to the D/A converters 7, 8 may be deviated by the portion corresponding to this deviation.

A specific example of circuitry and an example of operation of the phase adjusting means 10, 11 are shown below. In the embodiment, the circuitry of the phase adjusting means 10, 11 is identical, and the phase adjusting means 10 is representatively explained below in the following circuitry example.

Figure 2:
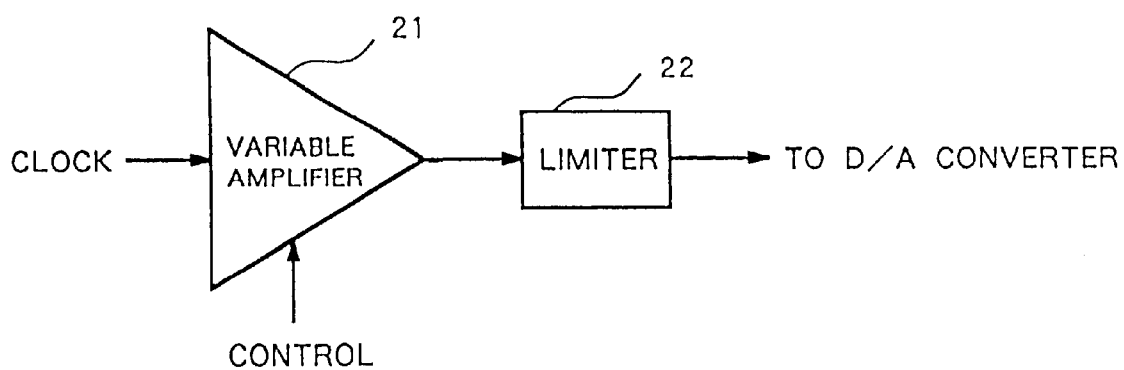
FIG. 2 is a diagram showing an example of circuitry of phase adjusting means.

FIG. 2 shows an example of circuitry of the phase adjusting means 10, and this phase adjusting means 10 is composed of a series connection of a variable (gain) amplifier 21 and a limiter 22.

The variable amplifier 21 has a characteristic of varying the gain depending on the control signal (for example, control voltage) entered from the controller 12, and amplifies the clock signal entered from the clock source 9 by the gain controlled by the controller 12, and sends the amplified signal to the limiter 22.

The limiter 22 has a characteristic of issuing the levels of the signals, for example, when signals having levels over a (fixed) predetermined threshold are entered, all at the same level (for example, the level corresponding to the threshold), and limits the level of the amplified signal entered from the variable amplifier 21 by this characteristic, and sends the limited amplified signal to the D/A converter 7 (D/A converter 8 in the case of phase adjusting means 11).

Figure 3:
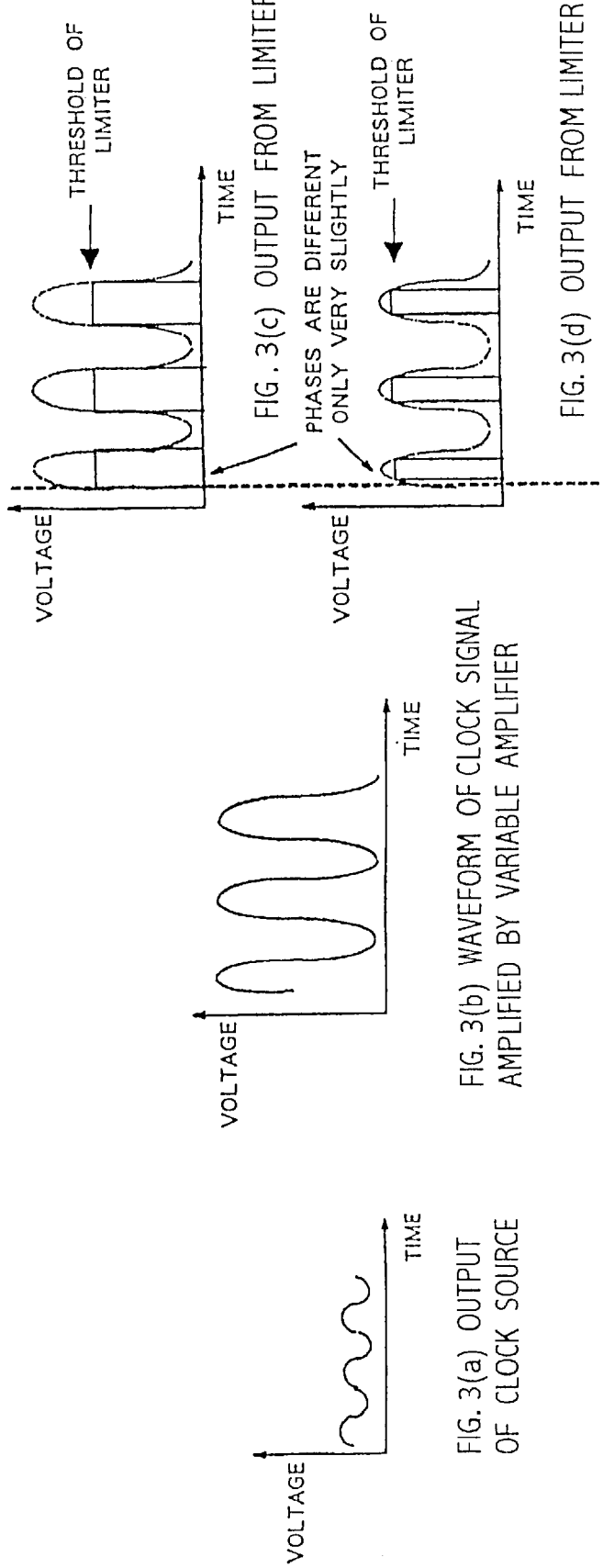
FIGS. 3(*a*)–(*d*) are diagrams for explaining an example of operation of phase adjusting means.

Referring to FIGS. 3(*a*)–(*d*), an example of operation of the circuit shown in FIG. 2 is explained. In the graphs (a) to (d) shown in the diagram, the axis of abscissas denotes the time and the axis of ordinates represents the voltage level.

FIG. 3(*a*) shows an example of waveform of a clock signal issued from the clock source 9.

FIG. 3(*b*) shows an example of waveform of a clock signal amplified by the variable amplifier 21.

In FIG. 3(*c*), a solid line shows an example of waveform of a signal after the amplified clock signal is processed by the limiter 22, and for the convenience of explanation, further, an example of the waveform of the amplified clock signal is indicated by a dotted line, together with an example of threshold set by the limiter 22. As shown in (c), since all input signals of the level above the threshold of the limiter 22 are clipped at a predetermined level (ON state), signals of square waves are issued from the limiter 22.

In FIG. 3(*d*), a solid line shows an example of a waveform of a signal after processing of the amplified clock signal by the limiter 22, relating to the case of control of lower gain of the variable amplifier 21 as compared with the case of FIG. 3(*c*), for the convenience of explanation, an example of the waveform of the amplified clock signal is indicated by a dotted line for reference, together with an example of a threshold set in the limiter 22 (the same value as in (c)).

As shown in FIG. 3(*d*), in the case where the gain of the variable amplifier 21 is relatively low, when the level of the sinusoidal wave entered in the limiter 22 becomes relatively large, its level is clipped. Thus, by varying the gain of the variable amplifier 21, the width of the time of the ON state of the signal issued from the limiter 22 is changed depending on the gain.

For example, as indicated by broken line in FIGS. 3(*c*) and (*d*), relating to two cases different in the gain of the variable amplifier 21, comparing the clipping time of the level of the amplified signal by the limiter 22, it is known that the phase of the signal issued from the limiter 22 is deviated depending on the gain.

In this embodiment, by controlling the gain of the variable amplifier 21 (that is, the voltage level of amplified clock signal) by the controller 12, a clock signal (timing signal) shifted in phase is generated and this signal is used as the input clock of the D/A converter 7, so that the operation timing of the D/A converter 7 can be (finely) adjusted. That is, since the D/A converter 7 operates at the timing of the rise (or fall) of the clock signal being entered, it therefore, can be adjusted by slightly (precisely) changing the timing of output of the (analog) control signal from the D/A converter 7.

Thus, in the constitution of the phase adjusting means 10, 11 as shown in FIG. 2, by controlling the gain of the variable amplifier 21 from the controller 12, clock signals (timing signals) having various phases can be generated, and hence, the delay time can be adjusted finely (precisely).

Figure 4:
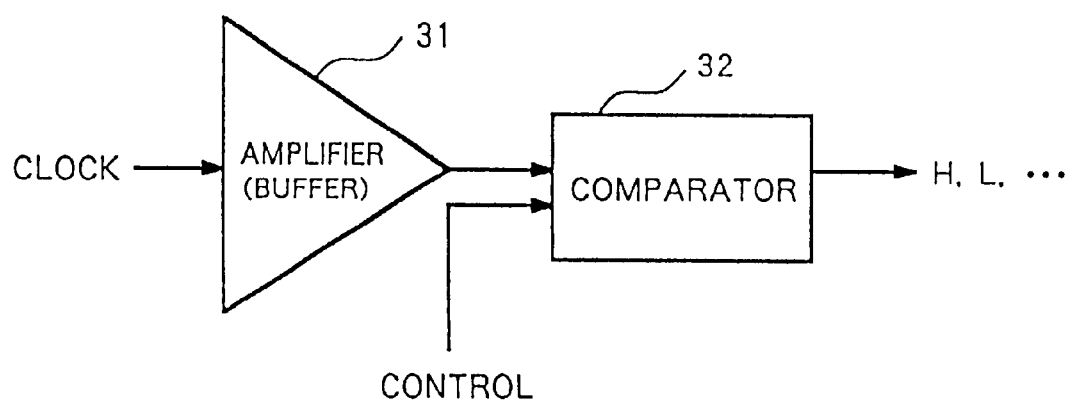
FIG. 4 is a diagram showing an example of circuitry of phase adjusting means.

FIG. 4 shows other example of circuitry of the phase adjusting means 10, and this phase adjusting means 10 is composed by series connection of an amplifier 31 and a comparator 32.

The amplifier 31 has a characteristic of being constant. For example, the (voltage) level of the output signal (for example, the gain of amplification is constant), and it amplifies the clock signal entered from the clock source 9, and sends the amplified signal to the comparator 32.

The amplifier 31 having such a characteristic is generally known as buffer, and such an amplifier 31 can be omitted from the circuitry as far as satisfying the condition that the phase adjusting means 10 is located physically close to the clock source 9, or the condition that the input signal into the phase adjusting means 10 (in this embodiment, the clock signal from the clock source 9) is not attenuated.

The comparator 32 receives an amplified signal issued from the amplifier 31 and a control signal issued from the controller 12, and compares the level of these two signals, and produces the result of the comparison as a value 1 (for example, high level) or a value 0 (for example, low level) to the D/A converter 7.

Specifically, in this embodiment, the (voltage) level of the control signal entered from the controller 12 to the comparator 32 is used as the threshold in the comparator 32, and this comparator 32 produces an ON signal (signal of value 1 in this case) when the (voltage) level of the signal issued from the amplifier 31 is higher than the threshold, and an OFF signal (signal of value 0 in this case) when the level is less than the threshold.

Figure 5:
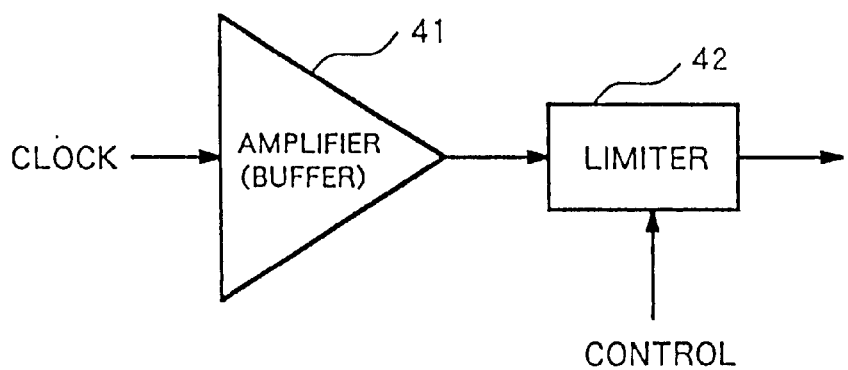
FIG. 5 is a diagram showing an example of circuitry of phase adjusting means.

FIG. 5 shows another example of circuitry of the phase adjusting means 10, and this phase adjusting means 10 is composed of a series connection of an amplifier 41 and a limiter 42.

The amplifier 41 has a characteristic of being constant, for example, the (voltage) level of the output signal (for example, the gain of amplification is constant), and it amplifies the clock signal entered from the clock source 9, and sends the amplified signal to the limiter 42.

Same as described in relation to the circuitry in FIG. 4, such an amplifier 41 can be omitted from the circuitry as far as satisfying the specified condition.

The limiter 42 has a characteristic of varying the threshold depending on the control signal entered from the controller, 12, and when a signal having a level higher than the threshold is entered, it also has a characteristic of issuing the level of the signal all at the same level (for example, the level corresponding to the threshold), and the level of the amplified signal entered from the amplifier 41 is limited by this characteristic, and a controlled amplified signal is sent out to the D/A converter 7.

Specifically, in this embodiment, the threshold of the limiter 42 is changed by the control (voltage) from the controller 12, and the limiter 42 limits the level when the (voltage) level of the signal entered from the amplifier 41 is over the threshold, and issues an ON signal (signal of value 1 in this case) at a specified (voltage) level.

Figure 6:
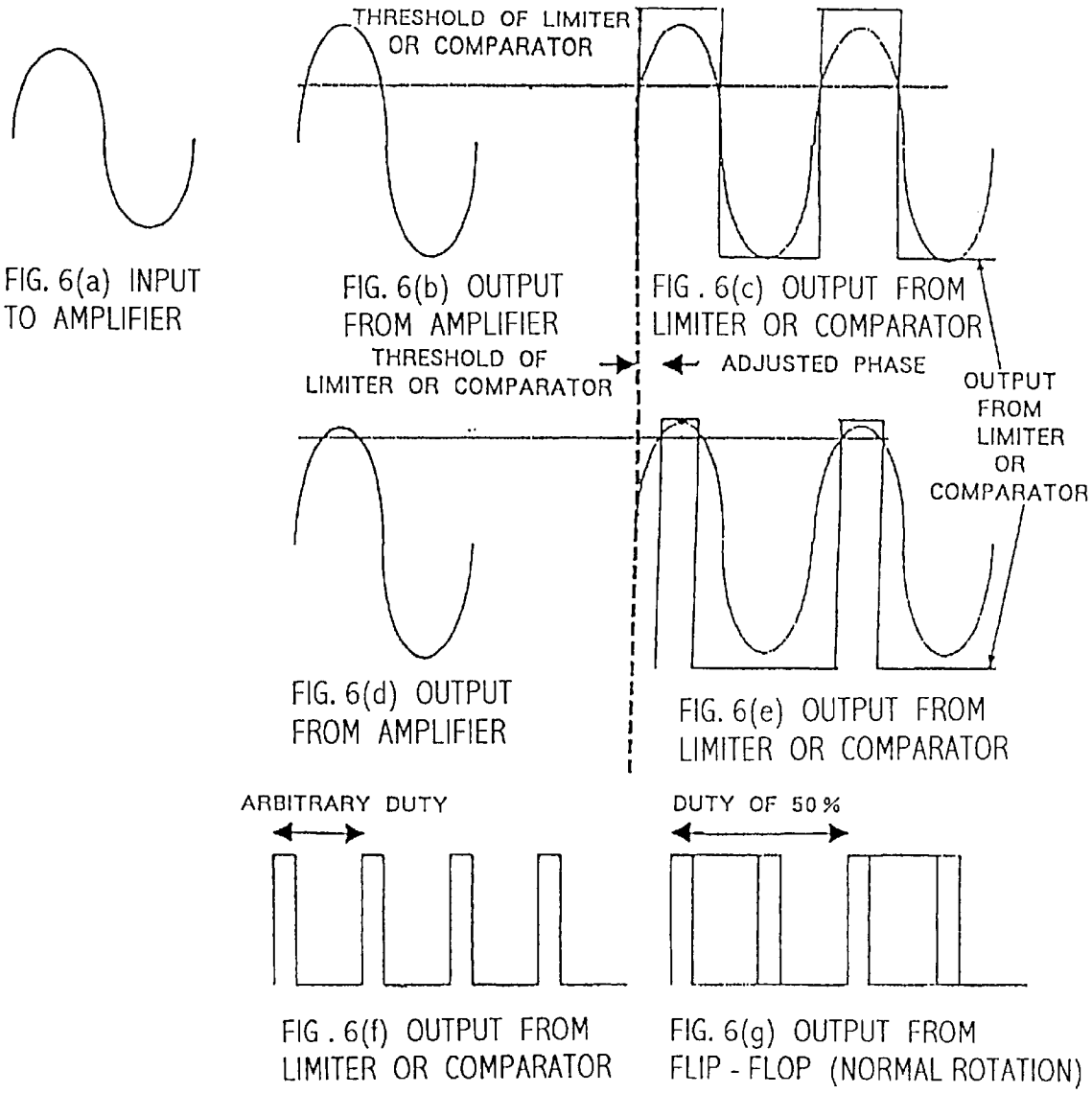
FIGS. 6(a)–(g) are diagrams for explaining an example of operation of phase adjusting means.

Referring to FIGS. 6(a)–(g), examples of operation of the circuit shown in FIG. 4 or FIG. 5 are presented. Herein, the circuit operation in FIG. 4 and the circuit operation in FIG. 5 have similar features, and operation examples of these two circuits are explained together. In FIGS. 6(a) to (g), the lateral direction denotes the time and the vertical direction indicates the voltage level of a signal. FIGS. 6(f) and (g) are described in detail later.

FIG. 6(a) shows an example of waveform of a clock signal issued from the clock source 9 and entered in the amplifier (amplifier 31 or amplifier 41).

FIGS. 6(b) and (d) show examples of waveforms of a clock signal amplified (for example, provided with some faxed gain) by the amplifier (amplifier 31 or amplifier 41).

FIGS. 6(c) and (e) show, by solid line, examples of waveforms of signals issued from the phase adjusting means 10 (comparator 32 or limiter 42) to the D/A converter 7 when the threshold (of comparator 32 or limiter 42) is changed (in FIGS. 6(c) and (d)), and also show, by dotted lines, examples of waveforms of a clock signal provided for the amplifier (amplifier 31 or amplifier 41) for the convenience of explanation, and also examples of the threshold (set by the comparator 32 or limiter 42) are indicated by dotted lines.

As shown in FIGS. 6(c) and (e), in the constitution of the phase adjusting means 10, 11, shown in FIG. 4 and FIG. 5, by controlling the threshold of the comparator 32 or threshold of the limiter 42 from the controller 12, clock signals (timing signals) having various phases can be generated, so that the delay time can be adjusted finely (precisely). That is, in this embodiment, instead of varying the gain in the amplifier (amplifier 31 or amplifier 41), by varying the value (threshold) of the reference voltage to the comparator 32 in a later stage or the threshold of the limiter 42 in a later stage, the phase of the clock-signal can be changed.

Figure 7:
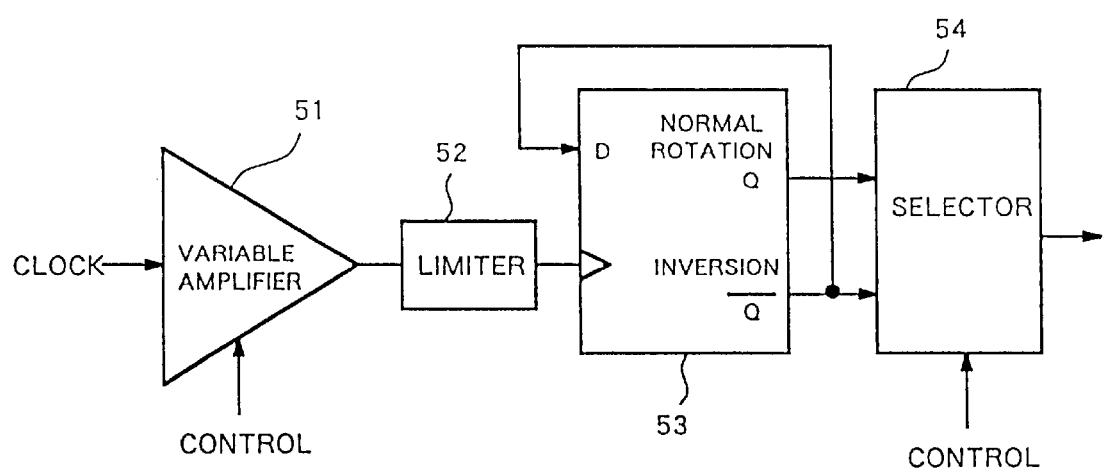
FIG. 7 is a diagram showing an example of circuitry of phase adjusting means.

FIG. 7 shows a different example of circuitry of the phase adjusting means 10, and this phase adjusting means 10 is composed of a series connection of a variable (gain) amplifier 51, a limiter 52, a flip-flop (D-FF) 53, and a selector 54.

In such a circuit structure, the duty of the clock signal (timing signal) can be controlled by the flip-flop 53. As mentioned above, the D/A converters 7, 8 operate on the rise or fall of the entered clock signal (timing signal), but in the actual D/A converter, the minimum required time (duty) is often specified, for example, in the high level region or low level region of the input clock. In this case, in the circuitry shown in FIG. 2, FIG. 4, or FIG. 5, since the duty fluctuates, the phase variably shifted by the phase adjusting means 10 may be limited. In this structure, accordingly, the duty is shaped by the flip-flop 53.

The function and operation of the variable amplifier 51 are, for example, same as the function and operation of the variable amplifier 21 shown in FIG. 2, and the variable amplifier 51 amplifies the clock signal entered from the clock source 9 by the gain controlled by the controller 12, and sends the amplified signal to the limiter 52.

The function and operation of the limiter 52 are same as the function and operation of the limiter 22 shown in FIG. 2, and the limner 52 limits the level of the amplified signal entered from the variable amplifier 51 by a specified threshold, and sends the limited amplified signal to the flip-flop 53.

The flip-flop 53 has two input ends and two output ends, and receives the signal issued from the limiter 52 at one input end, and receives an inverted signal issued from one output end (output end of inverted signal) at other input end, and sends out the inverted signal from one output end to the other input end and to the selector 54, and also sends a normal rotation signal out from the other output end to the selector 54.

Herein, the normal rotation signal is, for example, a signal entered from the limiter 52 to the flip-flop 53 of which the duty is changed by the flip-flop 53, and the inverted signal is the signal of which on/off state is inverted.

The flip-flop 53 is generally used for setting the duty at 50%, and in the construction of this embodiment, the duty of the clock signal (timing signal) can be set to 50% as shown later in FIGS. 8(a) to (g).

The selector 54 has two input ends and one output end, and also has a function of changing over the output signal so that (only) the signal entered from either input end depending on the control signal from the controller 12 may be selectively issued from the output end. The selector 54 receives the inverted signal issued from one output end of the flip-flop 53 at one input end, and receives the normal rotation signal issued from the other output end of the flip-flop 53 at the other input end, and sends out either the inverted signal or normal rotation signal to the D/A converter 7 according to the control from the controller 12.

Referring now to FIGS. 8(a) to (g), an operation example of the circuit shown in FIG. 7 is shown. In FIGS. 8(a) to (g), the lateral direction indicates the time, and the vertical direction represents the voltage level of a signal.

Specifically, FIG. 8(a) shows an example of waveform of a clock signal issued from the clock source 9 and entered in the variable amplifier 51.

FIGS. 8(b) and (d) show examples of waveforms of a clock signal provided for the variable amplifier 51 by using different gains (in FIGS. 8(b) and (d)).

FIGS. 8(c) and (e), corresponding to FIGS. 8(b) and (d), show examples, indicated by solid lines, of waveforms of a signal after processing of the amplified clock signal by the limiter 52, and an example, indicated by a dotted line, of a waveform of the amplified clock signal and an example, indicted by a dotted line, of a threshold set in the limiter 52, byway of reference.

As shown in FIGS. 8(c) and (e), by varying the gain of the variable amplifier 51, the phase of the generated clock signal (timing signal) varies, and the duty of the clock signal is changed at the same time.

In this embodiment, the duty of the clock signal (timing signal) is set to 50% by the flip-flop 53.

Specifically, FIG. 8(f) shows an example of waveform of the signal issued from the limiter 52, and at this stage, the duty of the signal varies depending on the (voltage) level of the signal issued from the variable amplifier 51.

In FIG. 8(g), an example of a waveform of a signal issued from the flip-flop 53 as, for example, normal rotation signal is indicated by a solid line, and an example of waveform of a signal entered at one input end of the flip-flop 53 (as shown in FIG. 8(f)) is indicated by a dotted line for reference. As shown in FIG. 8(g), at the stage of output of a signal from the flip-flop 53, the duty of the signal is 50%. In the flip flop 53, for example, signals repeating on/off states at each rise point of the signal entered from the limiter 52 are issued, and the duty of such signals is 50%.

In this embodiment, by shifting the rise time (or fall time) of the clock signal (timing signal) issued from the phase adjusting means 10, 11, the phase of the signal is shifted, but in the circuit structure up to the flip-flop 53, mentioned above, it is hard to shift the phase by more than 180 degrees.

Accordingly, in this embodiment, the phase of the clock signal (timing signal) can be controlled by the selector 54 in a range of, for example, 360 degrees.

That is, in this embodiment, by using the flip-flop 53 which generally produces a normal rotation signal and an inverted signal inverted in the rise time and fall time, mutually, and specifically, by controlling the selector 54 by the controller 12 so that either one of the normal rotation signal and the inverted signal may be issued from the selector 54, phase adjustment in a wide range can be realized.

In the circuitry shown in FIG. 7, since the period of the clock signal (timing signal) issued from the phase adjusting means 10, 11 is 2 times the period of the clock signal (from the clock source 9) entered in the phase adjusting means 10, 11 as shown in FIG. 8(g), the clock source 9 is designed to produce a clock signal having a speed double that (that is, half of the period) of the specified rate required in the input clock of, for example, the D/A converters 7, 8. As a specific example, when the D/A conversion rate by the D/A converters 7, 8 is 80 MHz, a clock source 9 for producing a clock signal of 160 MHz is used.

In FIG. 7, the flip-flop 53 and selector 54 are added to circuitry that is the same as shown in FIG. 2, and similarly, it is possible to adjust the duty of the clock signal (timing signal) by installing a flip-flop in a later stage of the comparator 32 shown in FIG. 4 and in a later stage of the limiter 42 shown in FIG. 5. Further, by installing a selector in a later stage of the flip-flop, it is also possible to expand the adjustable phase range in relation to the clock signal.

FIG. 6(f) shows an example of a waveform of a signal issued from the comparator 32 or limiter 42, the same as is shown, for example, in FIG. 8(f), and FIG. 6(g) also shows, the same as is shown, for example, in FIG. 8(g), an example of a waveform of a signal converted by 50% in the duty of the signal by the flip-flop as indicated by a solid line, and an example of a waveform (in FIG. 6(f)) of the signal before conversion as indicated by a dotted line.

Figure 9:
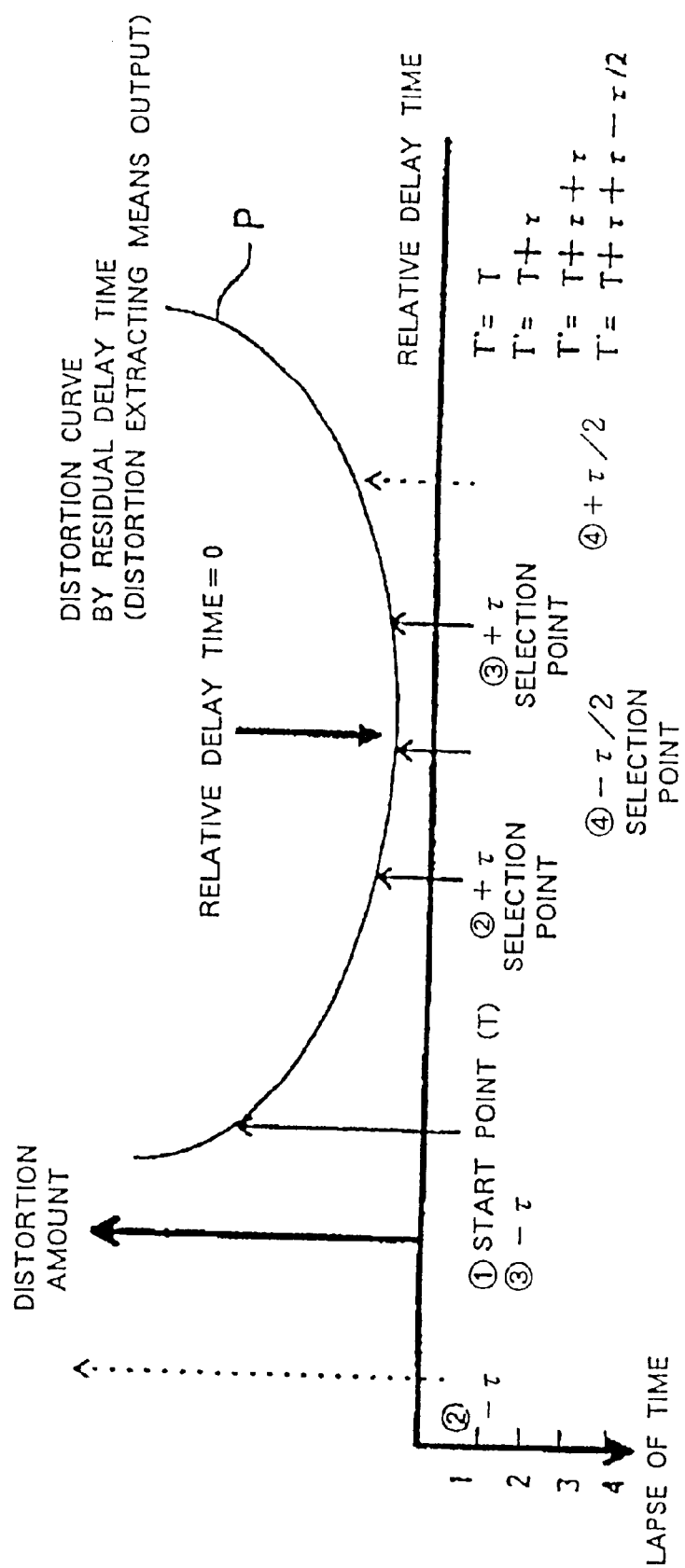
FIG. 9 is a diagram showing an example of an image for adj adjusting the delay time by perturbation method.

Referring next to FIG. 9, the perturbation method is shown as an example of a manner of adjusting the (relative) delay time by controlling the phase adjusting means 10, 11 by the controller 12.

That is, the distortion compensation by predistortion of the embodiment is conducted in conformity with the envelope of the signal to be amplified (by the amplifier 4). Thus, when compensating for the distortion of the signal to be amplified according to the measured envelope, it is necessary to adjust the (relative) delay time between the control system of distortion compensation (the system of the controller 12 or D/A converters 7, 8 side) and the main signal system in which the signal to be amplified flows (the system of the variable attenuator 2 or variable phase shifter 3 side).

Supposing that the adjustment of delay time is imperfect, a distortion component may be left over due to its effect in the signal issued from the amplifier 4 provided in a final stage. The presence or absence of such a distortion component can be easily judged by using a spectrum analyzer or the like, and the controller 12 in the embodiment detects the residual amount of distortion due to presence of delay time by monitoring the amount of distortion component by using the distortion extracting means 6.

As an example of the adjusting manner of the delay time as mentioned above, the adjustment by perturbation method is explained below.

Specifically, in the perturbation method, the delay time is adjusted by repeating the following process in (1) to (4).

(1) The amount of the distortion component is saved as P0 in the delay time T (the set delay time) at the present moment (after the process in (4) below, T=T').

(2) The delay time is adjusted by (+τ) (wherein τ is a set adjusting time) (that is, the delay time is further delayed to (T+τ)), and the amount of the distortion component at this time is P+.

(3) Together with step (2), the delay time is adjusted by (−τ) (that is, the delay time is advanced to (T−τ)), and the amount of the distortion component at this time is saved as P−.

(4) The distortion amounts P+ and P− are compared, and the delay time corresponding to the smaller distortion amount (either P+ or P−) is saved as a new delay time T'(T'=T+τ, or T'=T−τ).

By repeating the process in (1) to (4), the updated delay time T gets closer to the optimum state, and the difference between the distortion amount P0 and the distortion amount P+ or P− becomes smaller.

Or, for example, every time the difference between the distortion amount P0 and the distortion amount P+ or P− becomes smaller, preferably, the adjusting time used at step (2) or step (3) may be changed from (±t) to (±t/2) to reduce the adjusting time by half, so that the delay time can be adjusted adaptively.

FIG. 9 shows an example of an image of adjusting the delay time by the perturbation method, in which the axis of abscissas denotes the (relative) delay time, the axis of ordinates in the upper direction represents the amount of the distortion component, and the axis of ordinates in the lower direction shows the lapse of time. The diagram also includes a curve P showing the amount of the distortion component (the distortion component extracted by the distortion extracting means 6) caused by the residual delay time, and the delay time becomes zero at a position of minimum distortion component amount.

More specifically, in the perturbation method, first, the position of the delay time T at the present moment is set as the start point (point 1 in the diagram).

Consequently, at the next lapse of time, the distortion amount at position of delay time (T+τ) and the distortion amount at position of delay time (T−τ) are compared, and the delay time corresponding to the smaller distortion amount, for example, (T+τ) is selected as an updated delay time T' (point 2).

Further, at the next lapse of time, the distortion amount at position of delay time (T+τ+τ) and the distortion amount at position of delay time (T+τ−τ) are compared, and the delay time corresponding to the smaller distortion amount, for example, (T+τ+τ) is selected as an updated delay time T' (point 3).

As the updated delay time is getting closer to the optimum delay time (zero), it is judged that the distortion component amount is converging, and at the next lapse of time, the distortion amount at the position of the delay time (T+τ+τ+τ/2) and the distortion amount at the position of the delay time (T+τ+τ−τ/2) are compared, and the delay time corresponding to the smaller distortion amount, for example, (T+τ+τ−τ/2) is selected as an updated delay time T' (point 4).

By repeating such a process, the updated delay time is gradually set closer to the optimum delay time (zero).

As mentioned above, preferably, the delay time should be adjusted by a time error within, for example, [1/{carrier frequency interval×number of carriers×n}] (that is, in this embodiment, the difference from the optimum delay time of zero). Herein, as the carrier frequency interval and the number of carriers, the values relating to the transmission signal to be processed by the amplifying device of the embodiment are used, and the value of n is a positive number of 8 or more. The product of (carrier frequency interval× number of carriers) corresponds to the band of the transmission signal.

Thus, in the predistorter provided in the amplifying device of the embodiment, by adjusting the timing for controlling the amount of distortion (amplitude distortion or phase distortion) generated by the variable attenuator 2 or variable phase shifter 3 on the transmission signal to be provided for the amplifier 4 by the phase adjusting means 10, 11, the timing can be adjusted finely (precisely), so that distortion compensation of high precision can be realized.

Specifically, the failure of normal predistortion due to the presence of slight time delay can be avoided. Moreover, the adjustment process of slight delay time requiring a long time in the prior art can be done in a short time, and thereby the cost of the apparatus can be reduced.

In this embodiment, the amplifier 4 corresponds to the amplifier (as the object of distortion compensation) of the invention.

In the embodiment, the distortion generating means of the invention is composed by the function of the variable attenuator 2 and variable phase shifter 3. In the embodiment, the variable attenuator 2 and variable phase shifter 3 compose a circuit capable of changing the amount of distortion to be generated depending on the analog control signal entered from outside.

In the embodiment, the signal level detecting means of the invention is realized by the function of the level detector 5.

In the embodiment, the distortion amount control means of the invention is realized by the function of the controller 12 and two D/A converters 7, 8.

In the embodiment, the control timing adjusting means (control timing adjusting system) of the invention is realized by the function of the clock source 9 and two phase adjusting means 10, 11.

In the embodiment, the D/A converting means of the invention is realized by the function of the two D/A converters 7, 8.

In the embodiment, the clock signal generating means of the invention is realized by the function of the clock source 9.

In the embodiment, the timing signal generating means of the invention is realized by the function of the two phase adjusting means 10, 11 for generating a clock signal (timing signal) adjusted in its timing.

A (distortion compensation) amplifying device according to a second embodiment of the invention is explained below by referring to FIG. 10.

The amplifying device of the embodiment has a predistorter which is an example of the distortion compensation apparatus of the invention, and the distortion occurring in the amplifier is compensated by the predistorter type distortion compensation system by using this predistorter.

Figure 10:
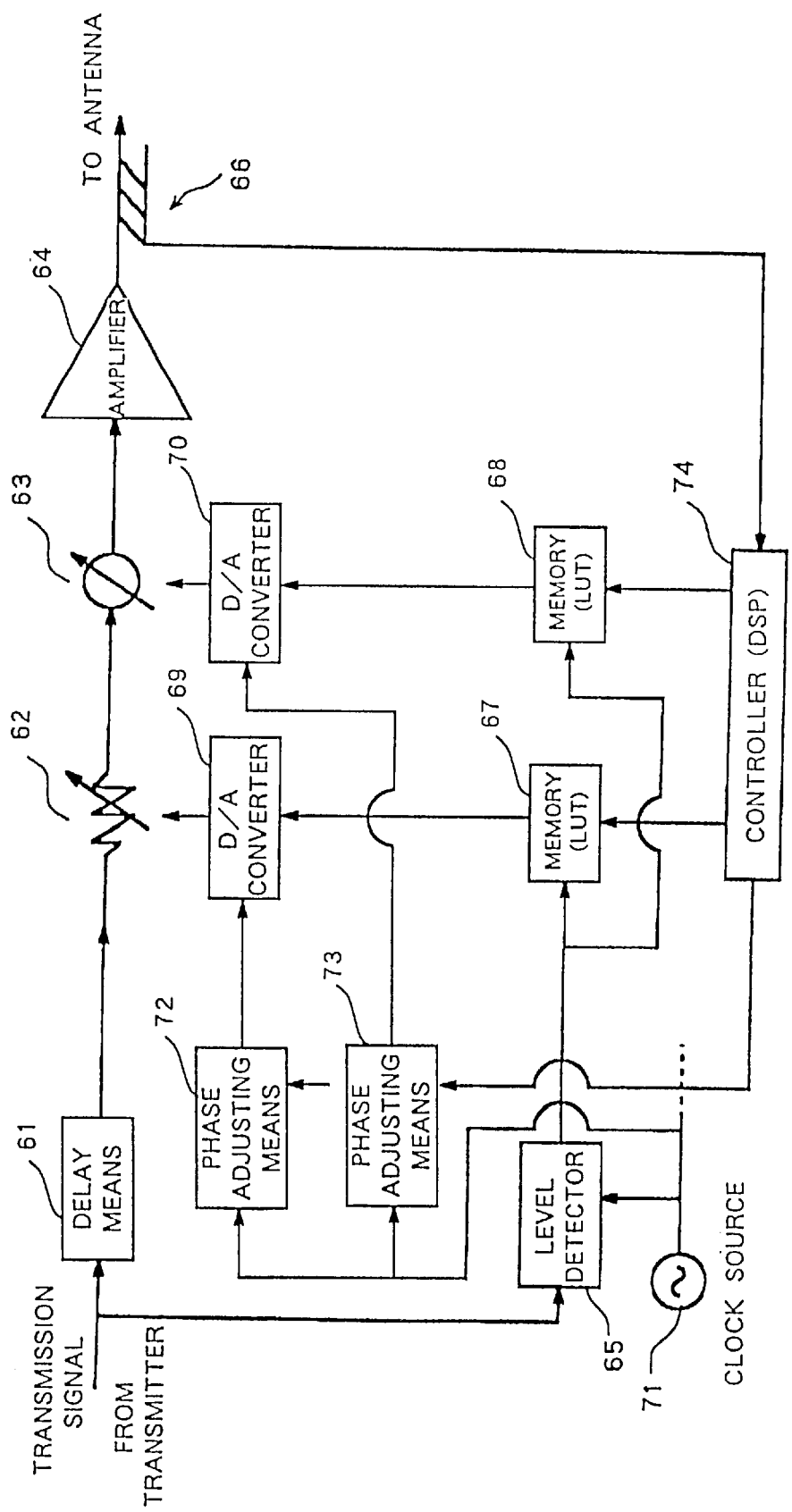
FIG. 10 is a diagram showing an example of circuitry of an amplifying device having a predistorter in a second embodiment of the invention.
Figure 11:
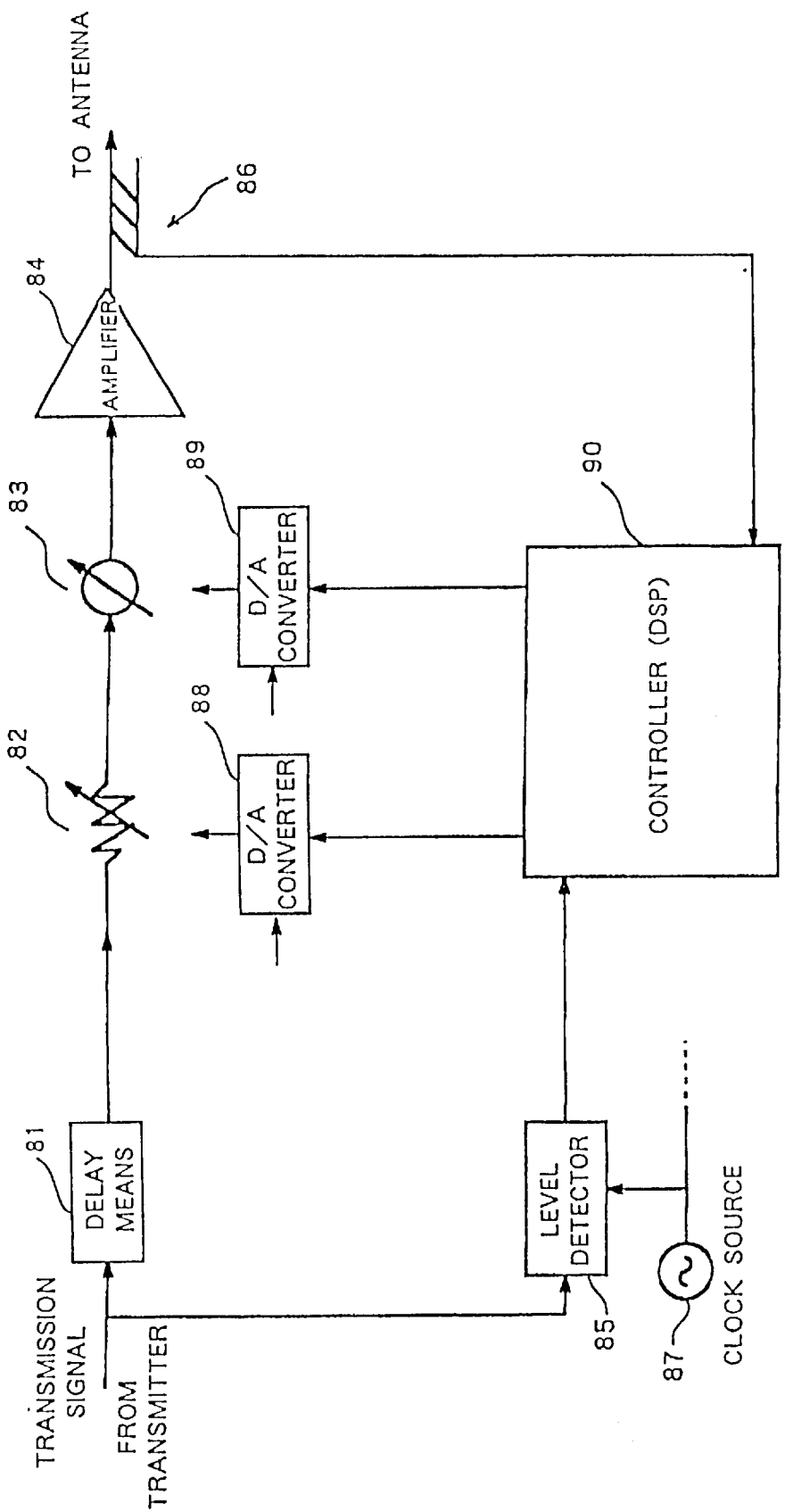
FIG. 11 is a diagram showing an example of circuitry of an amplifying device having a predistorter in the prior art.
Figure 12:
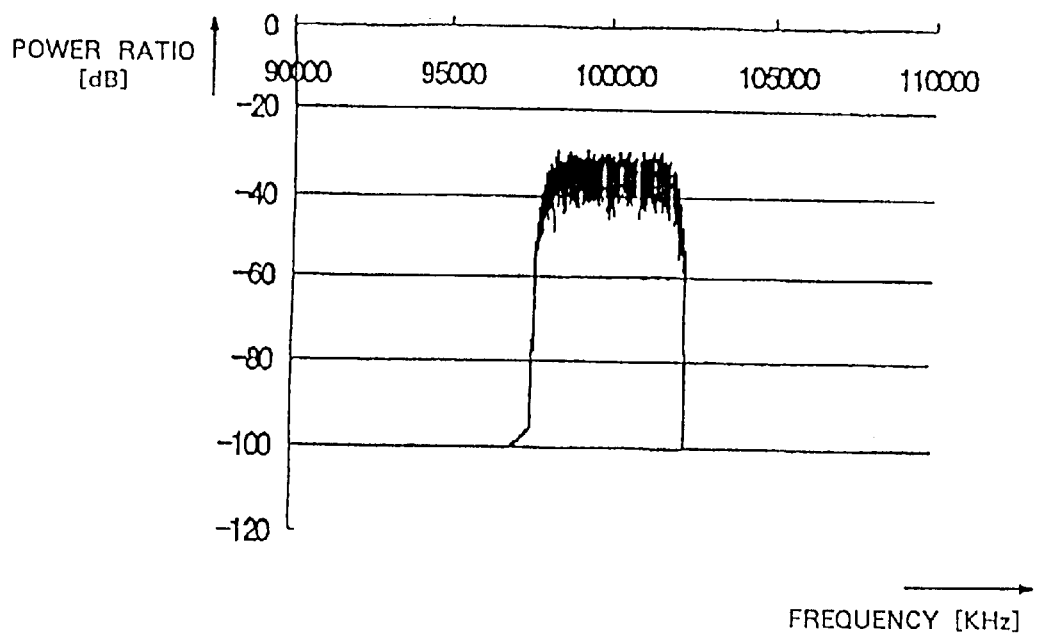
FIG. 12 is a diagram showing an example of a spectrum of a signal without distortion.
Figure 13:
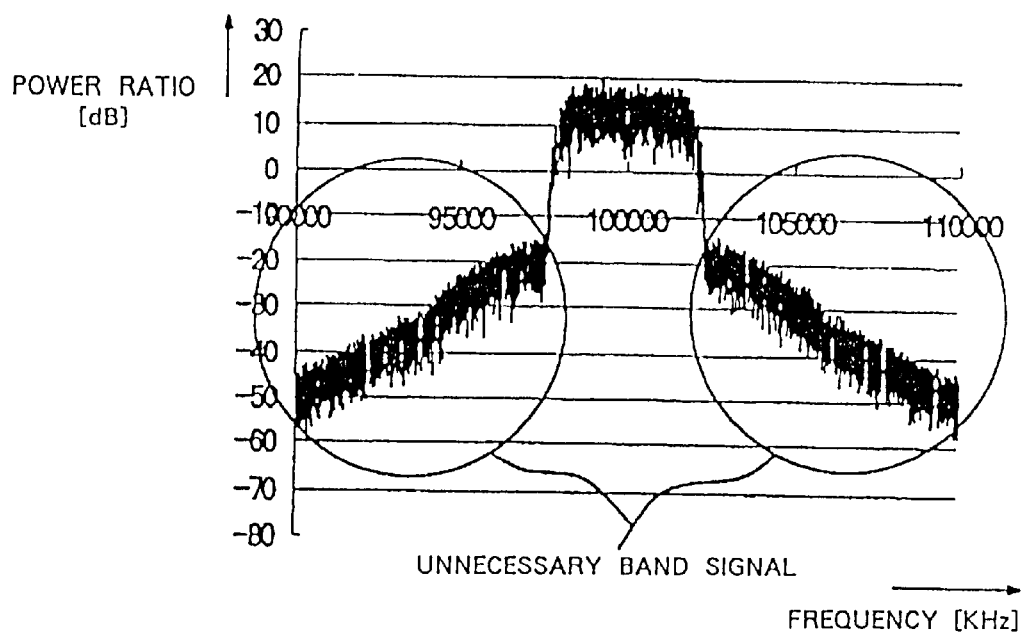
FIG. 13 is a diagram showing an example of a spectrum of a signal, having distortion.
Figure 14:
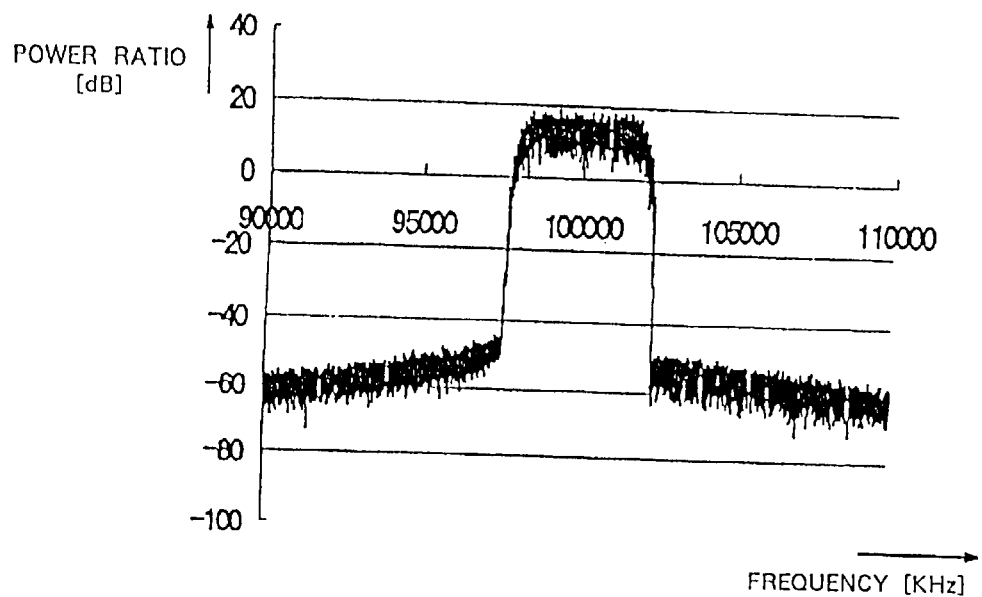
FIG. 14 is a diagram showing an example of a spectrum of a signal compensating distortion.
Figure 15:
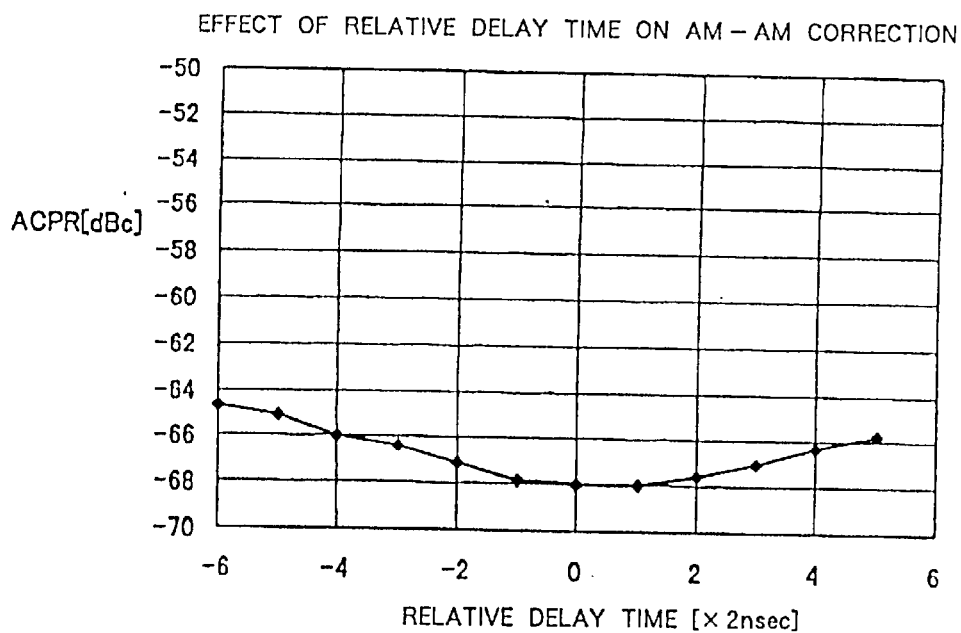
FIG. 15 is a diagram showing an example of a result of computer simulation about the effect of delay time on correction of amplitude distortion.
Figure 16:
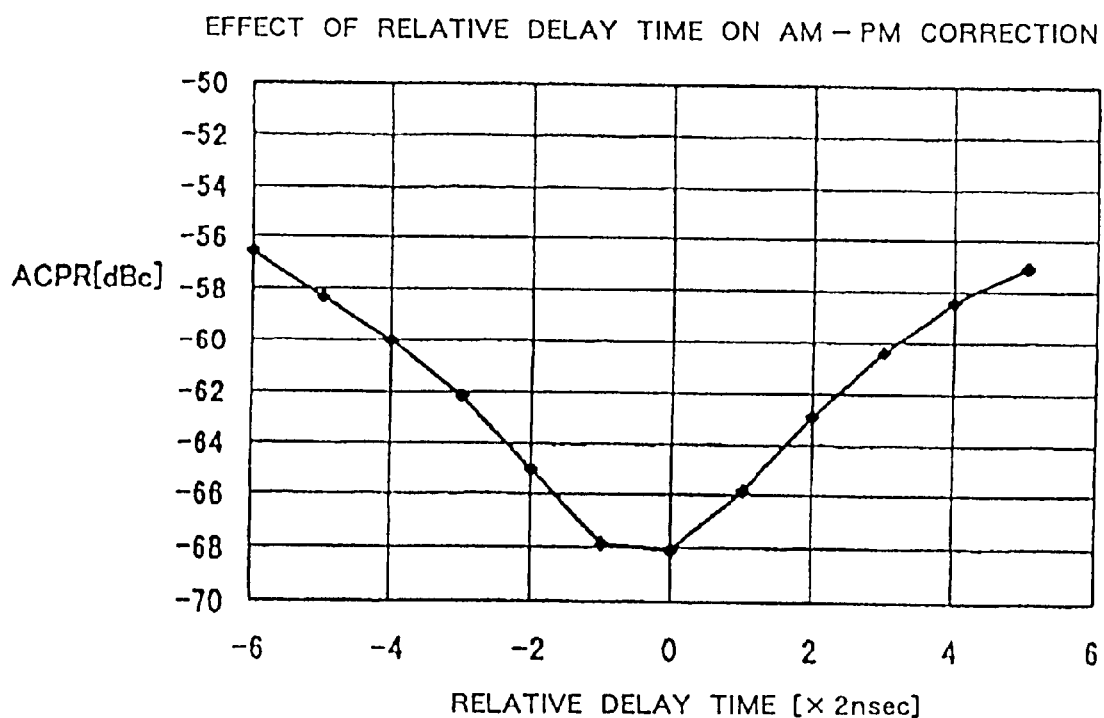
FIG. 16 is a diagram showing an example of a result of computer simulation about the effect of delay time on correction of phase distortion.

FIG. 10 shows an example of circuitry of an amplifying device having the predistorter of the embodiment (an amplifier with predistortion function). This amplifying device is provided in the transmission section of a base station or repeater station, for example, in a mobile wireless communication system, and the signal to be transmitted (transmission signal) is entered from a transmitter, and this signal is amplified in the amplifier, and sent out to an antenna.

As shown in the diagram, the amplifying device of the embodiment comprises delay means 61, a variable attenuator 62, a variable phase shifter 63, an amplifier 64, a level detector 65, distortion extracting means 66, two memories 67, 68, two D/A converters 69, 70, a clock source 71, two phase adjusting means 72, 73, and a controller 74.

The composition of the amplifying device of the embodiment is similar to the composition of the amplifying device of the first embodiment shown in FIG. 1, except that the memories 67, 68 for controlling the variable attenuator 62 and variable phase shifter 63 are provided outside of the controller 74. In the following explanation, same parts as in the amplifying device of first embodiment shown in FIG. 1 are not specifically described, and different parts as in the amplifying device of the first embodiment are described in detail.

That is, in the amplifying device of the embodiment, as the structure for controlling the variable attenuator 62, the memory 67 is provided between the controller 74 and the D/A converter 69, and as the structure for controlling the variable phase shifter 63, the memory 68 is provided between the controller 74 and the D/A converter 70. In the amplifying device of the embodiment, the result of detecting the signal level by the level detector 65 is issued to the two memories 67, 68 as a digital value.

One memory 67 has a look-up table (LUT) for controlling the variable attenuator 62, and this look-up table stores the (digital) control values for controlling the amplitude distortion to be generated in the variable attenuator 62, in correspondence to the digital values (of detection result) issued from the level detector 65. Herein, as the control value, the value for realizing the amplitude distortion (the amplitude distortion of reverse characteristic of the occurring amplitude distortion) capable of compensating for the amplitude distortion occurring in the amplifier 64 by predistortion when the digital value (detection result) corresponding to the control value is obtained is, for example, preliminarily calculated (or measured) and stored.

Similarly, the other memory 68 has a look-up table (LUT) for controlling the variable phase shifter 63, and this look-up table stores the (digital) control values for controlling the phase distortion to be generated in the variable phase shifter 63, in correspondence to the digital values (of detection result) issued from the level detector 65. Herein, as the control value, the value for realizing the phase distortion (the phase distortion of reverse characteristic of the occurring phase distortion) capable of compensating for the phase distortion occurring in the amplifier 64 by predistortion when the digital value (detection result) corresponding to the control value is obtained is, for example, preliminarily calculated (or measured) and stored.

Thus, the memory 67 has a look-up table for storing the corrected AM-AM characteristic, and the other memory 68 has a look-up table for storing the corrected AM-PM characteristic. These look-up tables execute the process of issuing the stored value (control value) corresponding to the input address to the D/A converters 69, 70 respectively, using the digital value (control value) entered from the level detector 65 as the address, and in this embodiment, by such processing, the amount of distortion generated by the variable attenuator 62 and variable phase shifter 63 can be controlled.

The D/A converters 69, 70 of the embodiment convert the digital control signals entered from the memories 67, 68 into analog control signals, and send the analog control signals to the variable attenuator 62 and variable phase shifter 63.

In this embodiment, meanwhile, on the basis of the level of the distortion component detected by, for example, the extracting means 66, the stored contents in the memories 67, 68 are adaptively rewritten by the controller 74, and such a constitution can realize predistortion capable of processing an error of a small delay time occurring due to, for example, temperature characteristic changes and aging effects.

Thus, in the amplifying device of the embodiment, since the memories 67, 68 for controlling the variable attenuator 62 and variable phase shifter 63 are composed separately from the controller 74 and disposed outside of the controller 74, fast access to the memories 67, 68 is possible, so that the efficiency of processing can be enhanced.

In the embodiment, the memory means of the invention is realized by the function of the two memories 67, 68.

For example, in the amplifying device of the embodiment, the digital section operating at 80 MHz is assumed, but generally if the D/A conversion process at about 80 MHz (12.5 nsec) is necessary, it is often difficult to access directly from the controller 74. The reason is because the controller 74 is often composed of a digital signal processor (DSP), and in the digital signal processor, 30 Hz is about the limit for the input and output rate (access speed of external hardware).

In contrast, in the amplifying device of the embodiment, as mentioned above, fast access is possible by disposing the memories 67, 68 outside of the controller 74, and in the case of processing a transmission signal of a wide band, for example, fine (precise) phase adjustment (timing adjustment of D/A conversion) can be realized easily.

The constitution of the distortion compensation apparatus according to the invention is not limited to the illustrated examples alone, but may be changed and modified in various forms.

For example, the sequence of disposition of the variable attenuator and variable phase shifter for predistortion is arbitrary. Also, for example, the structure for acquiring the signal (error signal) of distortion component from the output signal of the amplifier (as the object of distortion compensation), and the structure of the level detector may be realized in various modes.

For example, although not shown in the foregoing embodiments, a low pass filter (LPF) may be provided between the D/A converter and variable attenuator, or between the D/A converter and variable phase shifter, and the output signals from these D/A converters may be smoothed by the low pass filter. The presence or absence of such a low pass filter may be arbitrarily set, depending on the situation of use of the device or the like.

The application field of the distortion compensation apparatus of the invention is not limited to the shown fields alone, but the invention includes various other fields.

For example, the distortion compensation apparatus of the invention may be applied in the apparatus employing the predistortion type distortion compensation system using digital processing, and it is also possible to apply in the apparatus employing the predistortion type distortion compensation system using analog processing.

As various processes of a control program executed as the distortion compensation apparatus of the invention, for example, in a hardware resource having a processor and memories, the invention may be designed to control by the processor which executes the control program stored in a ROM, or various function means for executing the processes may be composed as independent hardware circuits.

The invention also relates to a computer-readable recording media, such as a floppy disk and CD-ROM storing these control programs, and by feeding the control programs into a computer from the recording media, and executing by a processor, the process of the invention can be executed.

As explained herein, according to the compensation distortion apparatus of the invention, for example, when controlling the amount of amplitude distortion or phase distortion generated by the variable attenuator or variable phase shifter on the signal to be provided for the amplifier, on the basis of the detection result of the level of the signal provided for the amplifier, the control timing is adjusted so that the distortion occurring in the amplitude may be compensated for sufficiently, and it is possible to adjust the timing finely (precisely), so that distortion compensation of high precision is realized.

What is claimed is:

1. A distortion compensation apparatus for compensating for distortion occurring in an amplifier, said distortion compensation apparatus comprising:

distortion generating means for generating distortion of one of an amplitude and a phase of a signal provided for the amplifier;

signal level detecting means for detecting a level of the signal provided for the amplifier;

distortion amount control means for controlling an amount of the distortion generated by said distortion generating means based on the level detected by said signal level detecting means; and control timing adjusting means for adjusting a timing for controlling the amount of the distortion by said distortion amount control means to adjust a delay time between a timing of the generating of the distortion of the signal by said distortion generating means and the timing of the controlling based on the level of the signal by said distortion amount control means, so that a residual amount of distortion due to a presence of the delay time in the signal issued from the amplifier is minimized.

2. The distortion compensation apparatus according to claim 1, wherein said control timing adjusting means adjusts the delay time between said distortion amount control means which controls the compensation of the distortion occurring in the amplifier and said distortion generating means in which the signal to be amplified flows and the distortion for compensation is generated, by selecting an adjusted delay time as an updated delay time on which a smaller residual amount of distortion from between a first delay time which corresponds to a result of adding a set delay time and a set adjusting time and a second delay time which corresponds to a result of subtracting the set adjusting time from the set delay time.

3. The distortion compensation apparatus according to claim 2, wherein said control timing adjusting means repeats updating of the delay time, so that the updated delay time is set closer to an optimum delay time.

4. The distortion compensation apparatus according to claim 3, wherein said control timing adjusting means reduces the set adjusting time as a difference between the residual amount of distortion on the set delay time and the residual amount of distortion on the adjusted delay time gets smaller.

5. A wireless transmission apparatus for transmitting signals wirelessly, said wireless transmission apparatus comprising:

an amplifier operable to amplify a signal; and a distortion compensation apparatus comprising:

distortion generating means for generating distortion of one of an amplitude and a phase of the signal provided for said amplifier;

signal level detecting means for detecting a level of the signal provided for said amplifier;

distortion amount control means for controlling an amount of the distortion generated by said distortion generating means based on the level detected by said signal level detecting means; and control timing adjusting means for adjusting a timing for controlling the amount of the distortion by said distortion amount control means to adjust a delay time between a timing of the generating of the distortion of the signal by said distortion generating means and the timing of the controlling based on the level of the signal by said distortion amount control means, so that a residual amount of distortion due to a presence of the delay time in the signal issued from said amplifier is minimized, wherein said distortion compensation apparatus compensates for the distortion occurring in said amplifier for amplifying the signal to be transmitted by said wireless transmission apparatus, and said control timing adjusting means adjusts the timing for controlling the amount of the distortion by said distortion amount controls means within an error in a unit of seconds of less than a value of a reciprocal number of a number of over-samplings times a value of a band of the signal to be transmitted.

6. The wireless transmission apparatus according to claim 5, wherein said control timing adjusting means adjusts the delay time between said distortion amount control means which controls the compensation of the distortion occurring in said amplifier and said distortion generating means in which the signal to be amplified flows and the distortion for compensation is generated, by selecting an adjusted delay time as an updated delay time on which a smaller residual amount of distortion from between a first delay time which corresponds to a result of adding a set delay time and a set adjusting time and a second delay time which corresponds to a result of subtracting the set adjusting time from the set delay time.

7. The wireless transmission apparatus according to claim 6, wherein said control timing adjusting means repeats updating of the delay time, so that the updated delay time is set closer to an optimum delay time.

8. The wireless transmission apparatus according to claim 7, wherein said control timing adjusting means reduces the set adjusting time as a difference between the residual amount of distortion on the set delay time and the residual amount of distortion on the adjusted delay time gets smaller.

9. A distortion compensation apparatus for compensating for distortion occurring in an amplifier, said distortion compensation apparatus comprising:

a control timing adjustment system operable to adjust a delay time between a control system of distortion compensation which controls the compensation of the distortion occurring in the amplifier and a main signal system in which a signal to be amplified flows and distortion for compensation is generated, by selecting an adjusted delay time as an updated delay time on which a smaller residual amount of distortion from between a first delay time which corresponds to a result of adding a set delay time and a set adjusting time and a second delay time which corresponds to a result of subtracting the set adjusting time from the set delay time.

10. The distortion compensation apparatus according to claim 9, wherein said control timing adjustment system is operable to repeat updating of the delay time, so that the updated delay time is set closer to an optimum delay time.

11. The distortion compensation apparatus according to claim 10, wherein said control timing adjustment system is operable to reduce the set adjusting time as a difference between the residual amount of distortion on the set delay time and the residual amount of distortion on the adjusted delay time gets smaller.

* * * * *